(12) United States Patent
Pan

(10) Patent No.: US 10,538,056 B2
(45) Date of Patent: Jan. 21, 2020

(54) ASSEMBLY STRUCTURE, METHOD TO FORM ASSEMBLY STRUCTURE AND METHOD TO FORM CLOSE-LOOP SEALANT STRUCTURE

(71) Applicant: Himax Display, Inc., Tainan (TW)

(72) Inventor: Po-Hung Pan, Tainan (TW)

(73) Assignee: Himax Display, Inc., Tainan (TW)

( * ) Notice: Subject to any disclaimer, the term of this patent is extended or adjusted under 35 U.S.C. 154(b) by 201 days.

(21) Appl. No.: 14/850,961

(22) Filed: Sep. 11, 2015

(65) Prior Publication Data

US 2017/0072661 A1 Mar. 16, 2017

(51) Int. Cl.
*B32B 7/12* (2006.01)
*B32B 37/12* (2006.01)
*B65B 63/00* (2006.01)
*B32B 9/04* (2006.01)
*G02B 26/08* (2006.01)
*G02B 27/00* (2006.01)
*B81C 1/00* (2006.01)

(52) U.S. Cl.
CPC .............. *B32B 7/12* (2013.01); *B32B 9/04* (2013.01); *B81C 1/00269* (2013.01); *G02B 26/0833* (2013.01); *G02B 27/0006* (2013.01); *B32B 2250/02* (2013.01); *B32B 2255/28* (2013.01); *B32B 2457/00* (2013.01); *B32B 2457/20* (2013.01); *B81C 2203/019* (2013.01); *H01L 2224/48091* (2013.01); *H01L 2224/73265* (2013.01); *H01L 2924/00014* (2013.01); *H01L 2924/1461* (2013.01)

(58) Field of Classification Search
CPC ............ B32B 7/12; B32B 37/12; B65B 63/00
USPC ................................ 257/43, 59, 414; 438/52
See application file for complete search history.

(56) References Cited

U.S. PATENT DOCUMENTS

| | | | | |
|---|---|---|---|---|
| 6,429,129 B1* | 8/2002 | Han | ................ | H01L 21/314 257/E21.264 |
| 2005/0258516 A1* | 11/2005 | Hong | ................ | B81C 1/00269 257/659 |
| 2008/0123171 A1* | 5/2008 | Dausch | ................ | F16K 99/0001 359/230 |
| 2009/0142564 A1* | 6/2009 | Plissonnier | ................ | C23C 16/30 428/220 |
| 2013/0050807 A1* | 2/2013 | Lee | ................ | G02B 26/005 359/316 |
| 2014/0319998 A1 | 10/2014 | Han | | |
| 2015/0179605 A1* | 6/2015 | Dubey | ................ | H01L 24/80 257/777 |

FOREIGN PATENT DOCUMENTS

| | | | |
|---|---|---|---|
| TW | 201403187 A | | 1/2014 |
| TW | 201413333 A | | 4/2014 |

* cited by examiner

*Primary Examiner* — Sheng-Bai Zhu
(74) *Attorney, Agent, or Firm* — Winston Hsu

(57) ABSTRACT

An assembly structure is provided. A first material layer is disposed on a substrate. A hydrophobic layer is chemically attached to the first material layer. A patterned second material layer is disposed on the substrate, without the hydrophobic or slightly chemically attached with hydrophobic molecules and surrounded by the first material layer. A close-loop sealant wall is directly disposed on the patterned second material layer. A cover layer is directly disposed on the close-loop sealant wall to entirely cover the close-loop sealant wall.

7 Claims, 26 Drawing Sheets

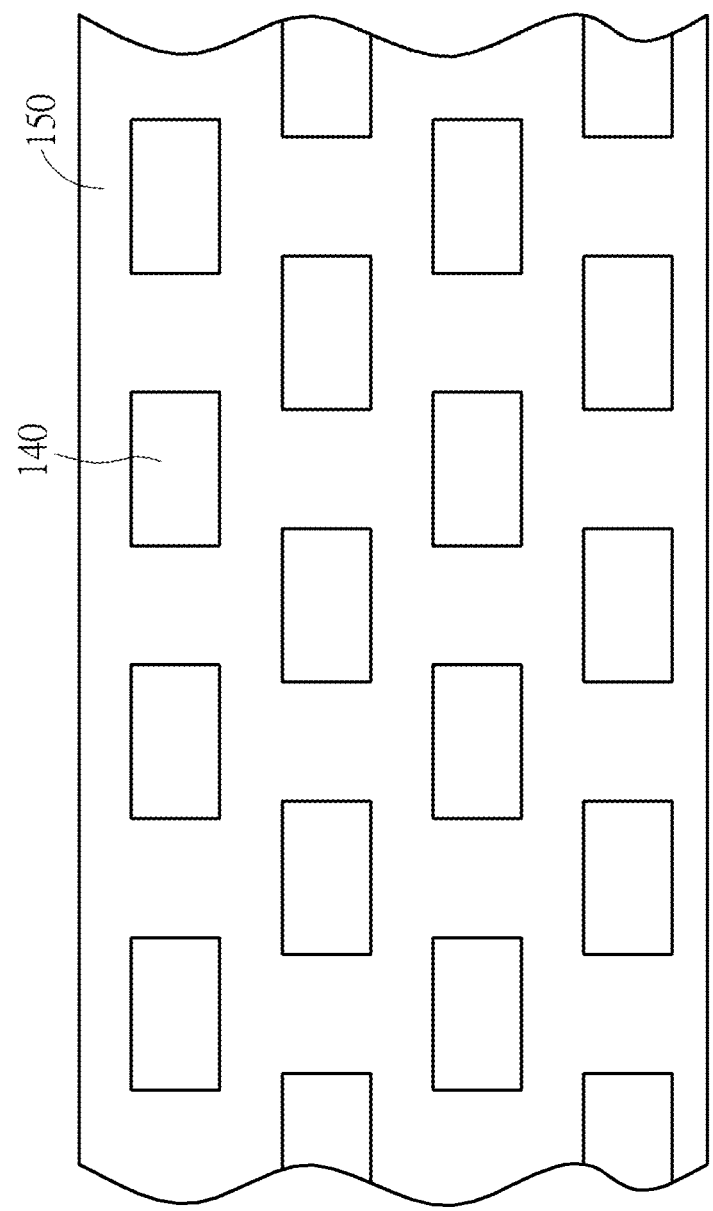

ASSEMBLY STRUCTURE, METHOD TO FORM ASSEMBLY STRUCTURE AND METHOD TO FORM CLOSE-LOOP SEALANT STRUCTURE

BACKGROUND OF THE INVENTION

1. Field of the Invention

The present invention generally relates to an assembly structure, a method to form an assembly structure and a method to form a close-loop sealant structure. In particular, the present invention is directed to an assembly structure, a method to form an assembly structure and a method to form a close-loop sealant structure by using a discriminative introduction of a hydrophobic layer which is capable of being chemically attached to a surface to selectively construct a close-loop sealant wall in the assembly structure.

2. Description of the Prior Art

In the current micro electro mechanical system (MEMS) processes, such as for a micro-display, the substrate needs surface modification for the proceeding electrical properties checks. However, since the modified surface has a surface energy too low for the sealant to firmly adhere to the modified surface, accordingly the deterioration of the modified surface is subsequently needed to facilitate the dispensing of a sealant onto the surface of the substrate. An open-loop sealant wall is usually formed between the substrate and cover glass. The current procedures may be explained as follows:

Wafer→ALD (atomic layer deposition) film→first surface modification→electrical properties check→deterioration of the first surface modification→dispensing open-loop sealant on the surface→assembling components→second surface modification→packaging Because the modified low-energy surface often prohibits an adhesive (sealant) from correctly adhering onto itself, a second surface modification is needed for packaging after the deterioration of the first surface modification, a new manufacturing process is still needed to deal with the above-mentioned problems and to simplify the current processes for the production of micro-displays.

SUMMARY OF THE INVENTION

In the light of the above, the present invention proposes an assembly structure, a method to form an assembly structure and a method to form a close-loop sealant structure. Because only one surface modification is needed in the method of the present invention, the deterioration of the first surface modification, the formation of the open-loop sealant and the introduction of the second surface modification to replace the first one may be all eliminated to simplify the process for the production of MEMS.

The present invention in a first aspect proposes an assembly structure. The assembly structure of the present invention includes a substrate, a first material layer, a hydrophobic layer, a patterned second material layer, a close-loop sealant wall and a cover layer. An element is disposed on the substrate. The first material layer is disposed on the substrate to cover the element to form an embedded element. The hydrophobic layer is chemically attached to the first material layer to modify the surface energy of the first material layer. The patterned second material layer is disposed on the substrate, without the hydrophobic layer and surrounded by the first material layer. The first material layer is materially different from the patterned second material layer. The close-loop sealant wall is directly disposed on the patterned second material layer. The cover layer is disposed on the close-loop sealant wall and in direct contact with the close-loop sealant wall to entirely cover the close-loop sealant wall.

In one embodiment of the present invention, the embedded element includes at least one of an optical element and a MEMS element.

In another embodiment of the present invention, the patterned second material layer has a rectangular rim.

In another embodiment of the present invention, the patterned second material layer is selected from a group consisting of tin oxide, chromium oxide, titanium oxide, iron oxide, nickel, iron, zinc, steel, copper, thermally evaporated silicon oxide, calcium carbonate, calcium sulfate and graphite when the first material layer is selected from a group consisting of aluminum oxide, ITO, quartz, silica and silicon.

In another embodiment of the present invention, the patterned second material layer is selected from a group consisting of thermally evaporated silicon oxide, calcium carbonate, calcium sulfate and graphite when the first material layer is selected from a group consisting of aluminum oxide, ITO, quartz, silica, silicon, tin oxide, chromium oxide, titanium oxide, iron oxide, nickel, iron, zinc, steel and copper.

In another embodiment of the present invention, the first material layer is recessed to accommodate the patterned second material layer which is in direct contact with the substrate.

In another embodiment of the present invention, the patterned second material layer is disposed on the first material layer and not in direct contact with the substrate.

In another embodiment of the present invention, the hydrophobic layer is not in direct contact with the close-loop sealant wall.

In another embodiment of the present invention, the close-loop sealant wall is in a form of a box.

The present invention in a second aspect proposes a method to form an assembly structure. First, a first material layer is formed to cover a substrate and an element. Second, a patterned second material layer is formed to be surrounded by the first material layer. Later, a selective modification step is carried out to exclusively modify the surface energy of the first material layer when both the first material layer and the patterned second material layer are present. Then, an examining step is carried out to exam an electrical property of the element disposed on the substrate after the selective modification step. Next, a cover layer is fixed to the substrate in the presence of a close-loop sealant to form an assembly structure. The close-loop sealant is attached to both the cover layer and the patterned second material layer.

In one embodiment of the present invention, the method to form an assembly structure further includes performing a curing step to cure the close-loop sealant to form a close-loop sealant wall.

In another embodiment of the present invention, the method to form an assembly structure further includes performing a packaging step to package the assembly structure to form an assembly package structure.

In another embodiment of the present invention, the patterned second material layer is selected from a group consisting of tin oxide, chromium oxide, titanium oxide, iron oxide, nickel, iron, zinc, steel, copper, thermally evaporated silicon oxide, calcium carbonate, calcium sulfate and graphite when the first material layer is selected from a group consisting of aluminum oxide, ITO, quartz, silica and silicon.

In another embodiment of the present invention, the patterned second material layer is selected from a group consisting of thermally evaporated silicon oxide, calcium carbonate, calcium sulfate and graphite when the first material layer is selected from a group consisting of aluminum oxide, ITO, quartz, silica, silicon, tin oxide, chromium oxide, titanium oxide, iron oxide, nickel, iron, zinc, steel and copper.

In another embodiment of the present invention, the first material layer is recessed to accommodate the patterned second material layer.

In another embodiment of the present invention, performing the selective modification step includes forming a hydrophobic layer which is exclusively attached to the first material layer.

In another embodiment of the present invention, the close-loop sealant is disposed on the cover layer when fixing the cover layer to the substrate.

In another embodiment of the present invention, the close-loop sealant is disposed on the patterned second material layer when fixing the cover layer to the substrate.

The present invention in a third aspect proposes a method to form a close-loop sealant structure. First, a substrate is provided. The substrate has an element disposed on the substrate and both a first material layer and a patterned second material layer are disposed on the substrate to cover the element. The patterned second material layer is surrounded by the first material layer. Second, a hydrophobic material is applied to both the first material layer and the patterned second material layer to selectively modify the surface energy of the first material layer. Later, a cover layer is fixed to the substrate in the presence of a close-loop sealant. Then, the close-loop sealant is cured to form a close-loop sealant structure so that the close-loop sealant structure is attached to both the cover layer and the patterned second material layer.

In one embodiment of the present invention, the patterned second material layer is selected from a group consisting of tin oxide, chromium oxide, titanium oxide, iron oxide, nickel, iron, zinc, steel, copper, thermally evaporated silicon oxide, calcium carbonate, calcium sulfate and graphite when the first material layer is selected from a group consisting of aluminum oxide, ITO, quartz, silica and silicon.

In another embodiment of the present invention, the patterned second material layer is selected from a group consisting of thermally evaporated silicon oxide, calcium carbonate, calcium sulfate and graphite when the first material layer is selected from a group consisting of aluminum oxide, ITO, quartz, silica, silicon, tin oxide, chromium oxide, titanium oxide, iron oxide, nickel, iron, zinc, steel and copper.

In another embodiment of the present invention, the first material layer is recessed to accommodate the patterned second material layer which is in direct contact with the substrate.

In another embodiment of the present invention, the close-loop sealant is disposed on the cover layer when fixing the cover layer to the substrate.

In another embodiment of the present invention, the close-loop sealant is disposed on the patterned second material layer when fixing the cover layer to the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6E shows the sealant rectangles arranged in an alternate pattern.

DETAILED DESCRIPTION

The present invention provides an assembly structure, a method to form an assembly structure and a method to form a close-loop sealant structure. By the introduction of a selective modification step to exclusively modify the surface energy of a first material layer when both the first material layer and a patterned second material layer are present, and resultantly a hydrophobic layer is chemically attached to the first material layer to exclusively modify the surface energy of the first material layer. With the help of the hydrophobic layer, a sealant material may be exclusively applied onto the patterned second material layer in a form of a close-loop. The close-loop sealant material may be later cured to form a close-loop sealant wall in an assembly structure.

The present invention provides a method to form an assembly structure. This method may also be used to form a close-loop sealant structure. FIG. 1 to FIG. 8 illustrates the exemplary procedures of the method of the present invention. Please refer to FIG. 1. First, a substrate 100 is provided. There is an element 101 disposed on the surface of the substrate 100. For example, the element 101 may be an optical element or a MEMS element, such as a micro-mirror, an electrode or a hinge. The substrate 100 may be a bare silicon wafer.

Figure 1:
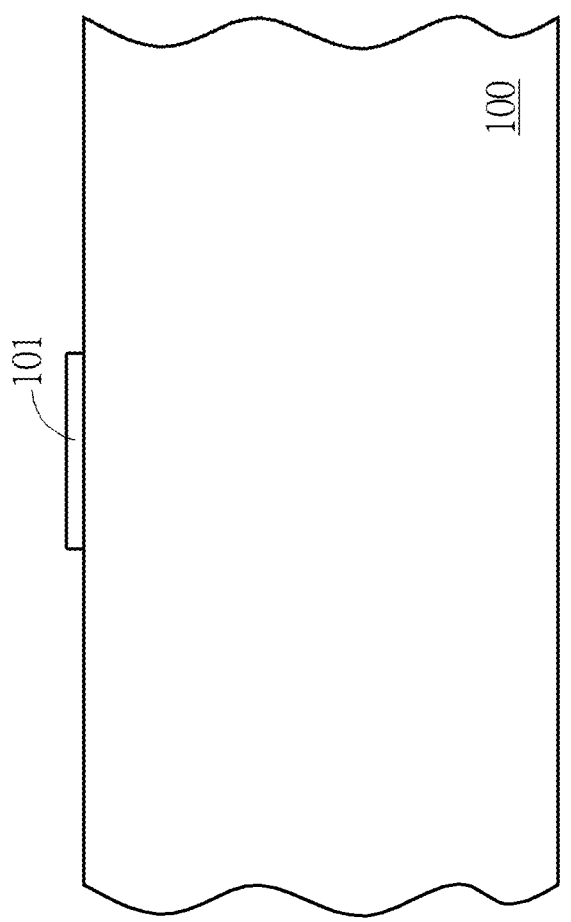
FIG. 1 to FIG. 8 illustrates the procedures in the method of the present invention.
Figure 2:
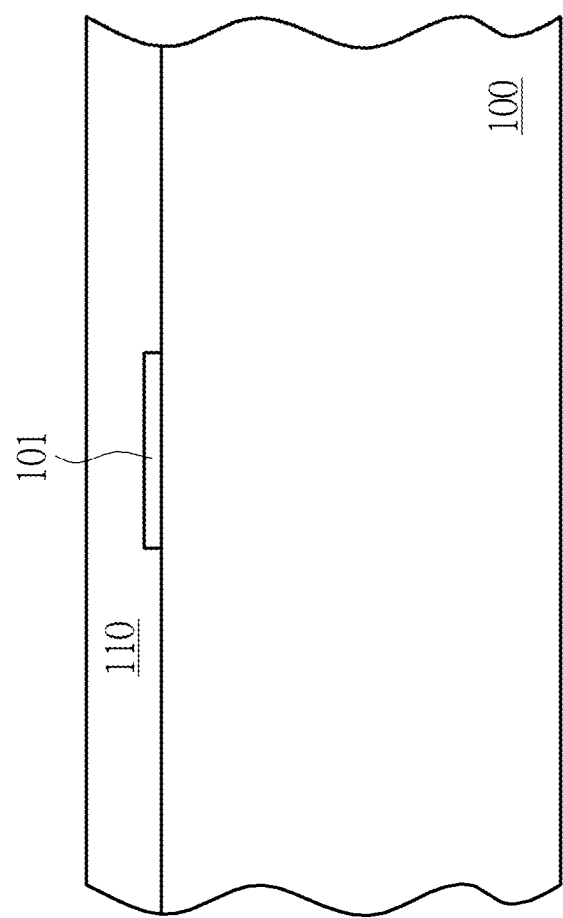
Figure 2A:
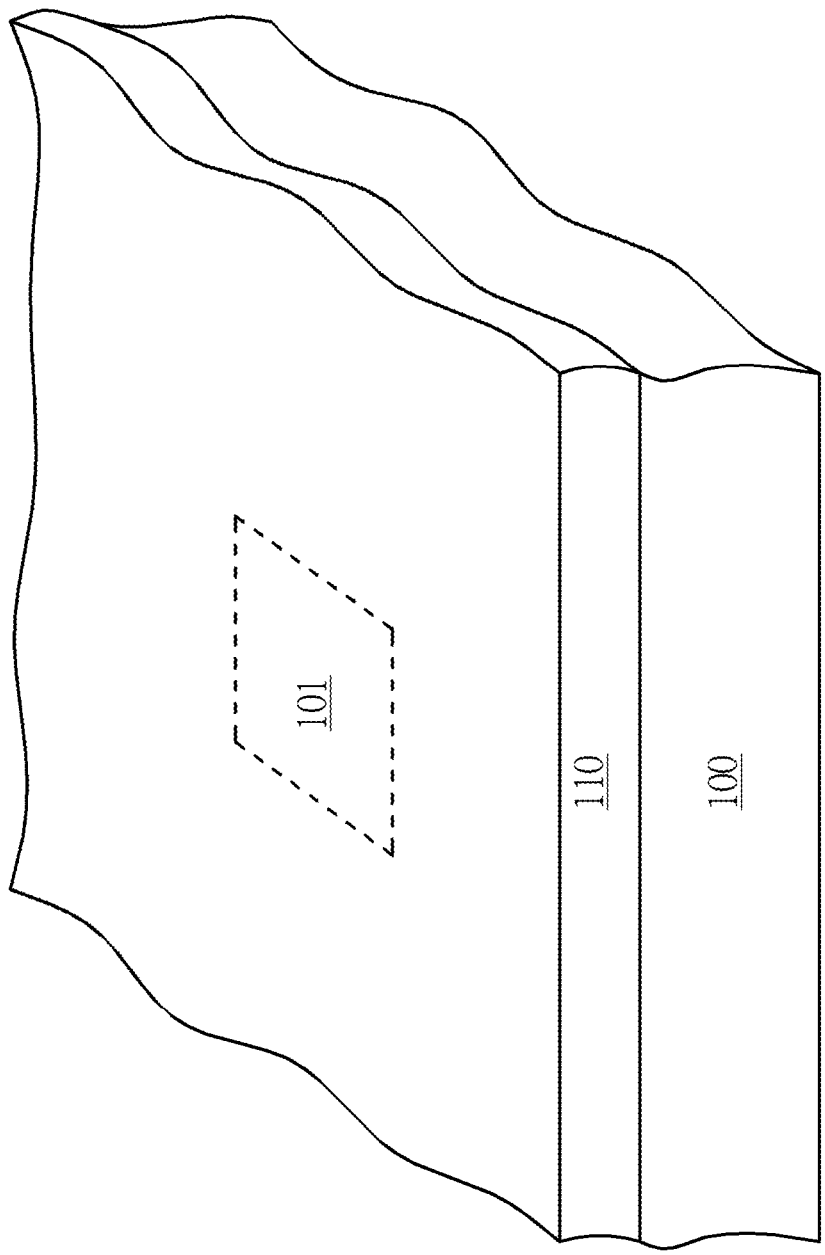
FIG. 2A shows a top view of FIG. 2.

Second, please refer to FIG. 2, a first material layer 110 is formed to cover the substrate 100 and the element 101, preferably the first material layer 110 is formed to entirely cover the surface of the substrate 100 and makes the element 101 an embedded element 101. The first material layer 110 may be formed by an atomic layer deposition (ALD). The thickness of the first material layer 110 is not critical or limited, and is preferably as thin as possible. FIG. 2A shows a perspective view of the substrate 100 illustrated in FIG. 2.

Later, please refer to FIG. 3, a patterned second material layer 120 is formed on the substrate 100, so both the first material layer 110 and the patterned second material layer 120 are disposed on the substrate 100 with the embedded element 101 disposed on the substrate 100. The patterned second material layer 120 is preferably surrounded by the first material layer 110. The first material layer 110 refers to a periphery region 105 and the second material layer 120 refers to a sealant region 106. FIG. 3A shows a perspective view of the substrate 100 illustrated in FIG. 3.

Figure 3:
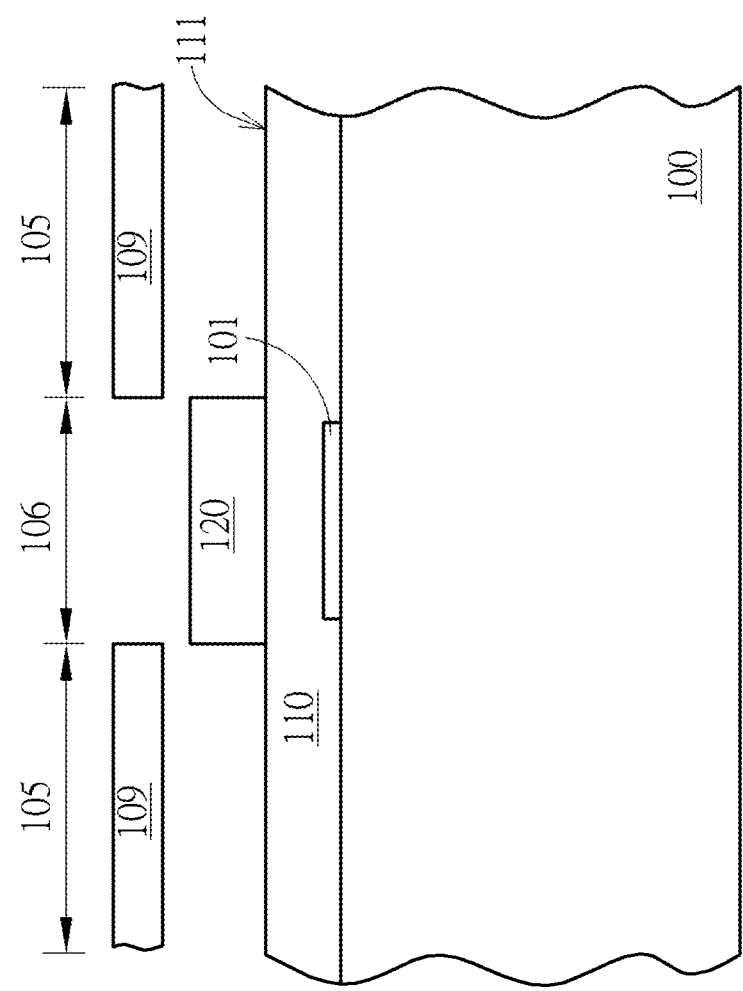
Figure 3A:
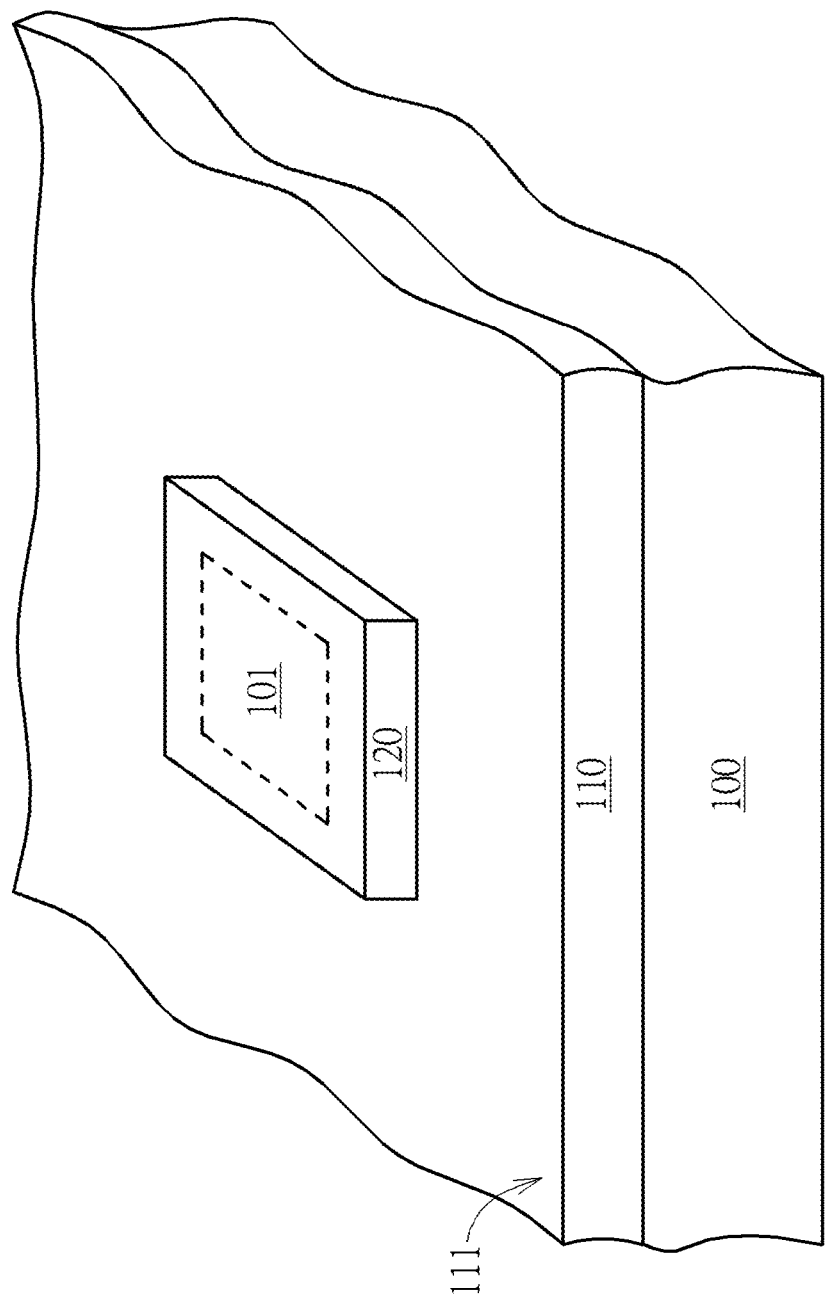
FIG. 3A shows a top view of FIG. 3.
Figure 3B:
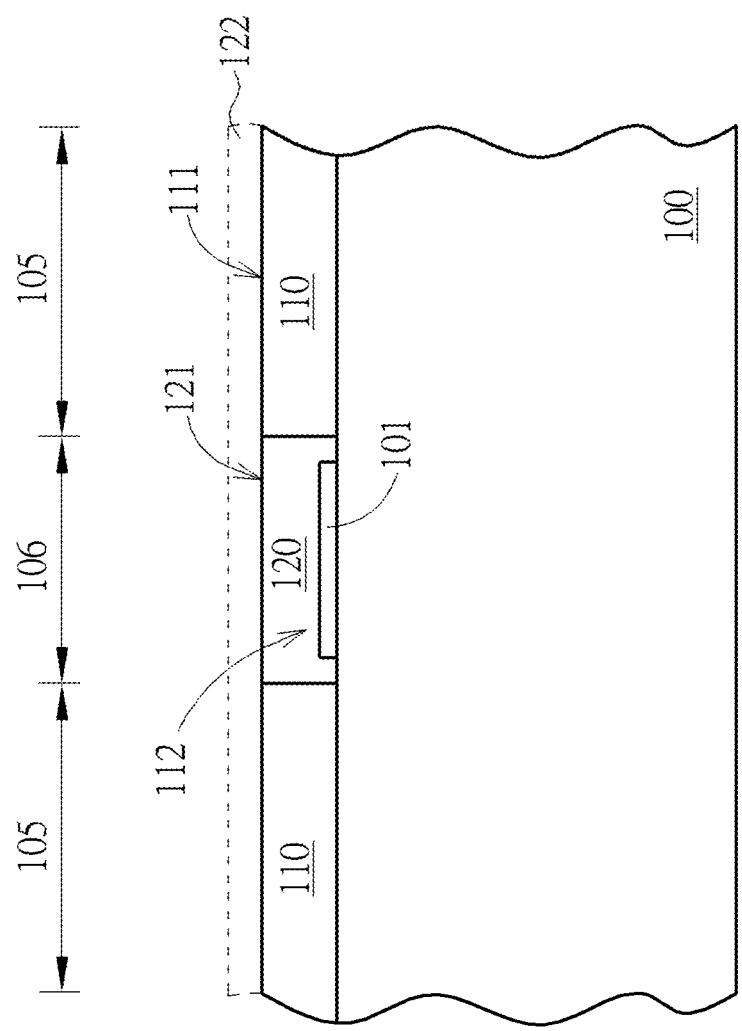
FIG. 3B shows the patterned second material layer embedded in the first material layer.

The patterned second material layer 120 may be formed directly on the first material layer 110, as shown in FIG. 3 or in FIG. 3A. Or, the patterned second material layer 120 may be formed to be embedded in the first material layer 110, as shown in FIG. 3B, so the surface 121 of the patterned second material layer 120 is as high as the surface 111 of the first material layer 110. Alternatively, the first material layer 110 may be recessed to accommodate the patterned second material layer 120, as shown in FIG. 3C, so the surface 121 of the patterned second material layer 120 is lower than the surface 111 of the first material layer 110.

The thickness of the patterned second material layer 120 is not critical or limited, so the thickness of the patterned second material layer 120 may be higher, lower, or as thick as the thickness of the first material layer 110. The first material layer 110 is chemically different from the patterned second material layer 120.

If the patterned second material layer 120 is formed on the surface 111 of the first material layer 110, a patterned mask 109 may be used to facilitate the formation of the patterned second material layer 120 which is directly disposed on the first material layer 110, as shown in FIG. 3. When the patterned second material layer 120 is needed to be embedded in the first material layer 110, the formation of the patterned second material layer 120 may be carried out after a recess 112 for accommodating the patterned second material layer 120 is formed by a patterned mask (not shown) along with an etching procedure. As shown in FIG. 3B, the excess patterned second material layer 122 by deposition may be removed so that the surface 121 of the patterned second material layer 120 is as high as the surface 111 of the first material layer 110. In this embodiment, the patterned second material layer 120 is in direct contact with the substrate 100.

Figure 3C:
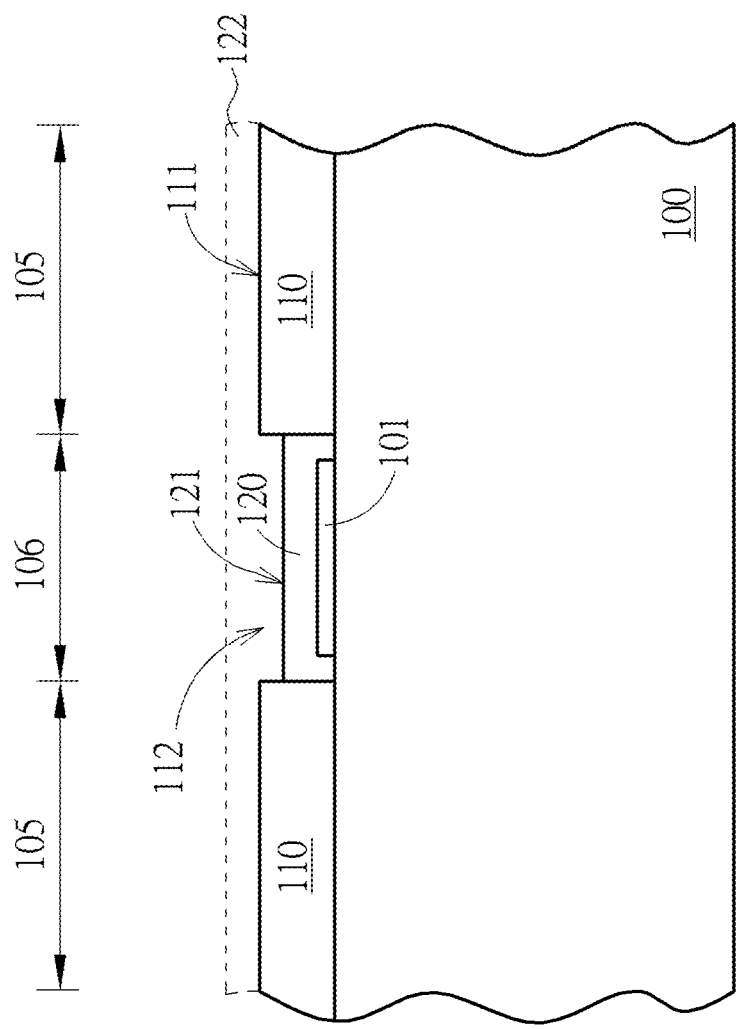
FIG. 3C shows the patterned second material layer depressed in a recess of the first material layer.

Supposing the patterned second material layer 120 is needed to be recessed in the first material layer 110, the formation of the patterned second material layer 120 may be carried out after a recess 112 for accommodating the patterned second material layer 120 is formed by a patterned mask (not shown) along with an etching procedure, as shown in FIG. 3C. The excess patterned second material layer 122 by deposition may be further removed by an etching-back procedure so that the surface 121 of the patterned second material layer 120 is lower than the surface 111 of the first material layer 110. In this embodiment, the patterned second material layer 120 is indirect contact with the substrate 100. The formation of the patterned second material layer 120 as shown in FIG. 3, FIG. 3A, FIG. 3B and FIG. 3C is well known by persons of ordinary skills in the art so the details are not elaborated here.

Figure 4:
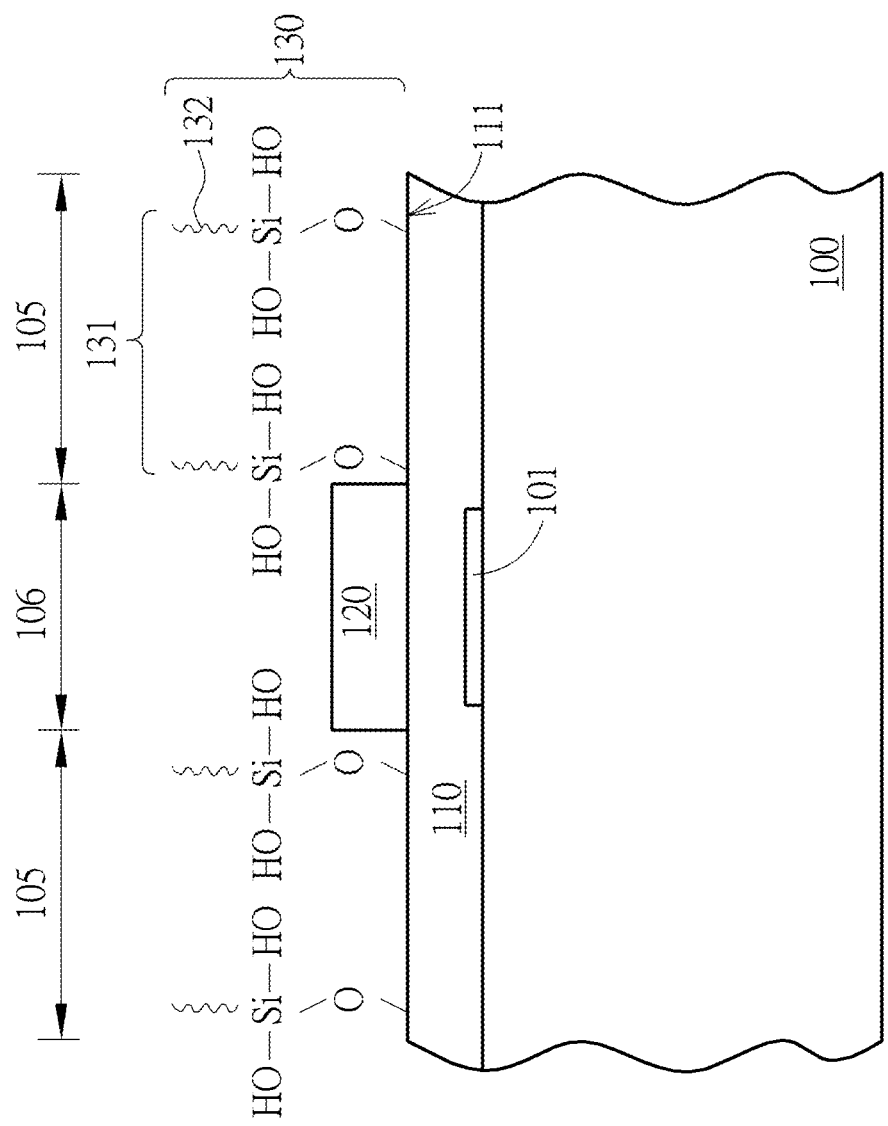
Figure 4A:
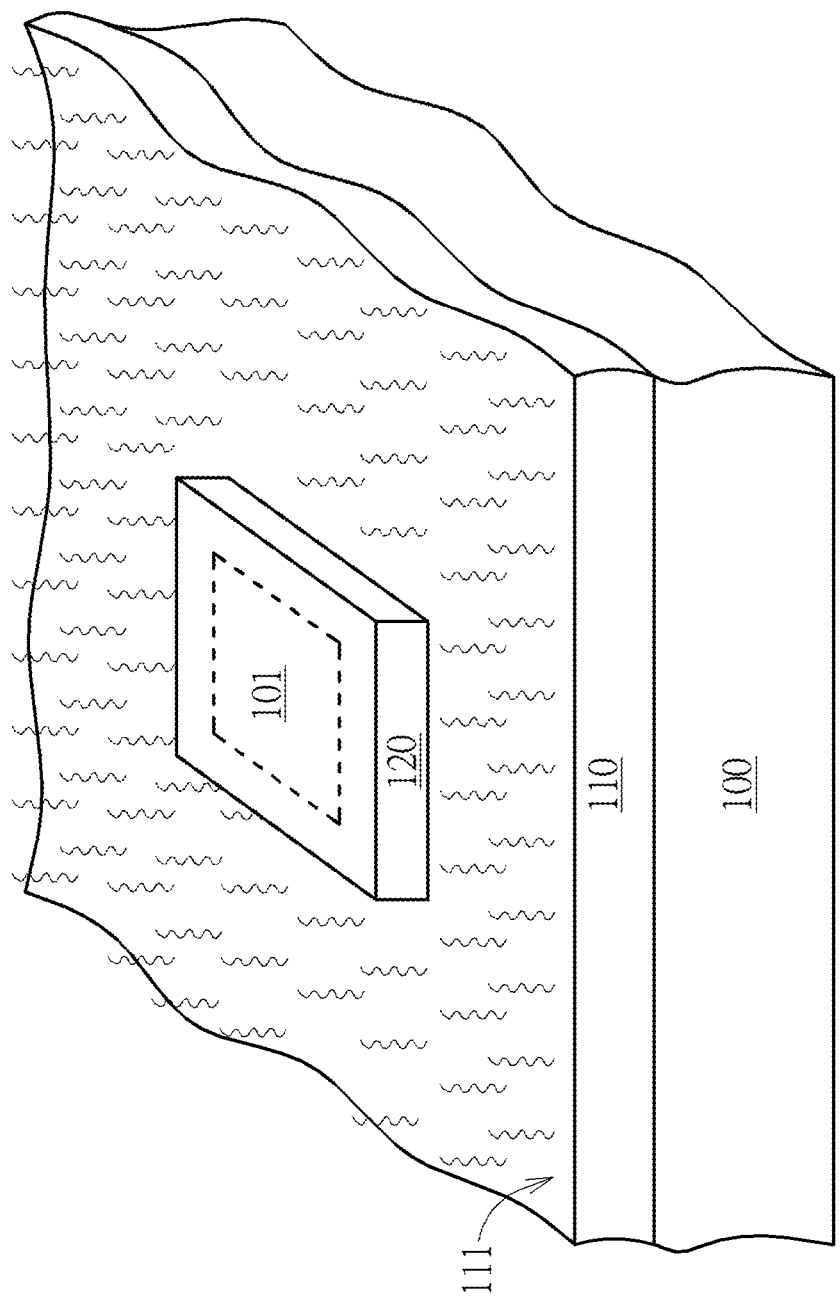
FIG. 4A shows the top view of FIG. 4.
Figure 4B:
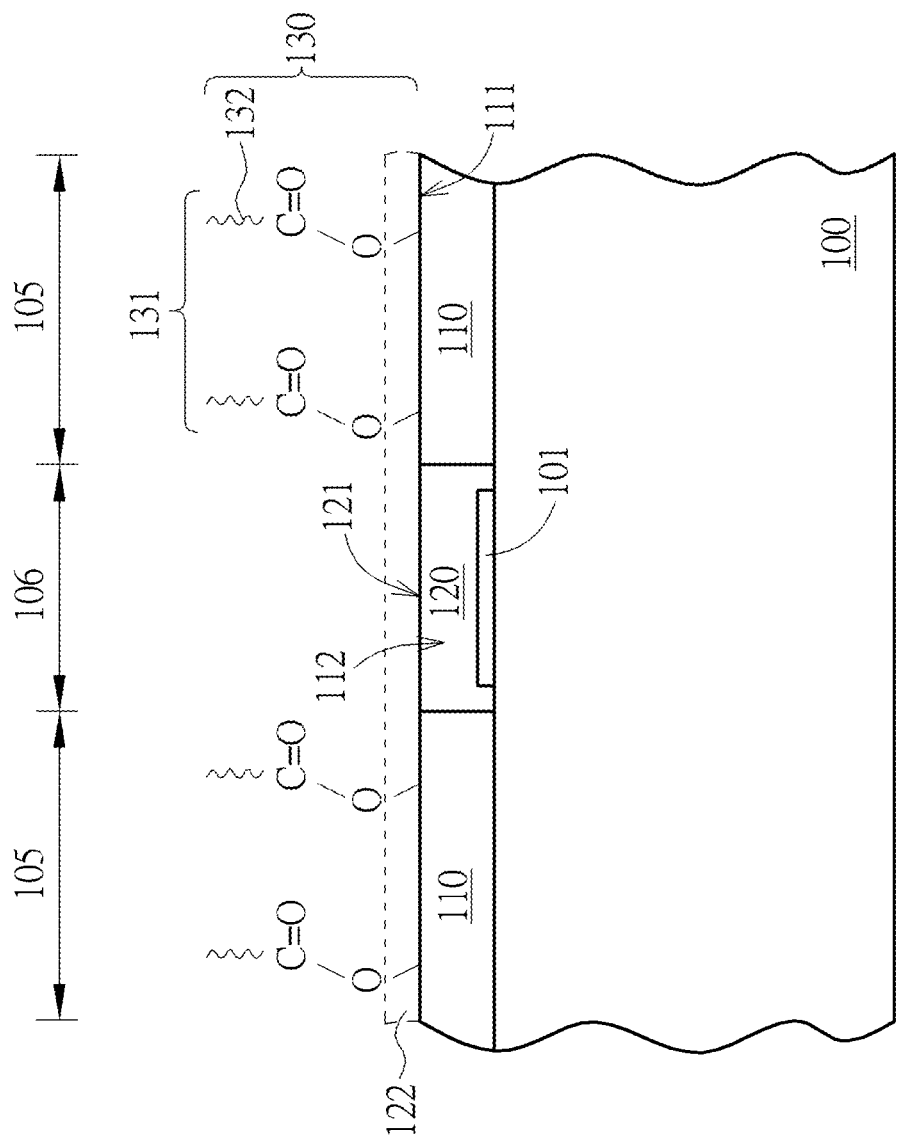
FIG. 4B shows the patterned second material layer embedded in the modified first material layer.
Figure 4C:
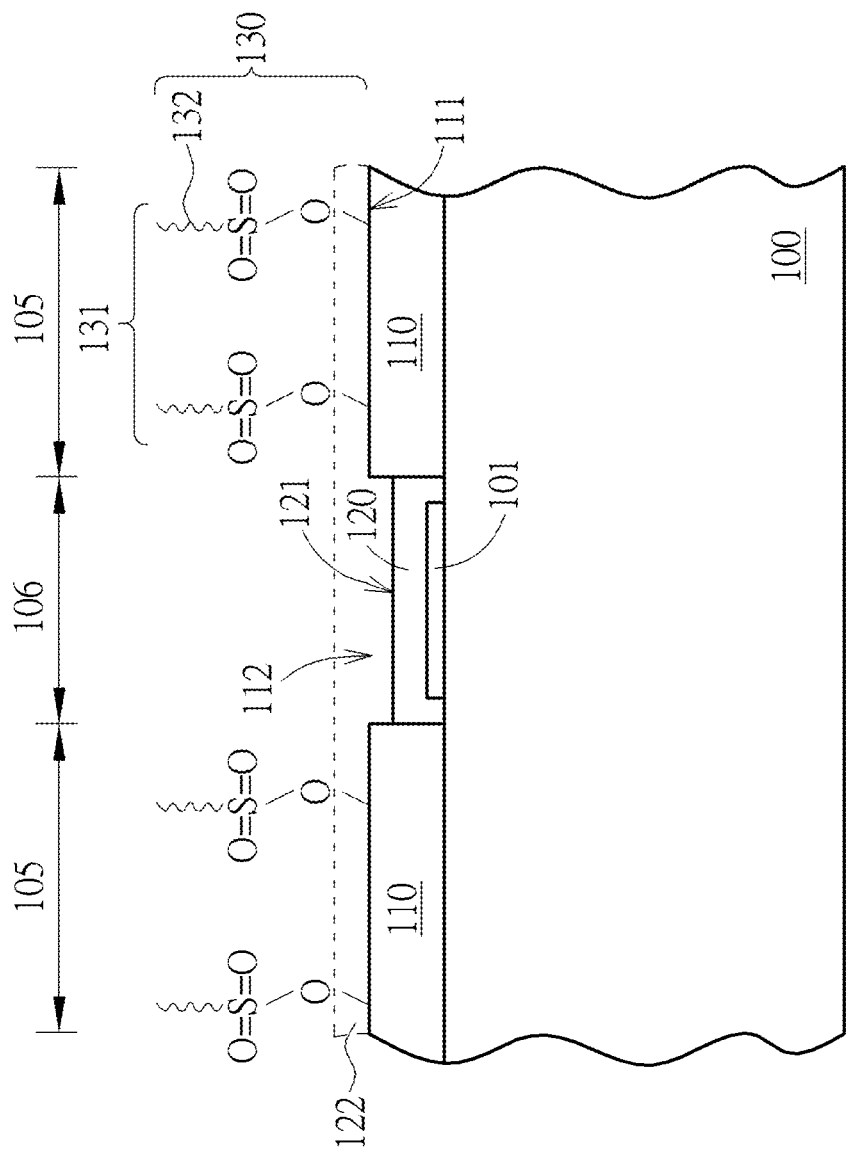
FIG. 4C shows the patterned second material layer depressed in a recess of the modified first material layer.

Then, please refer to FIG. 4, FIG. 4A, FIG. 4B and FIG. 4C, a selective modification step is carried out in order to exclusively modify the surface energy of the first material layer 110 when both the first material layer 110 and the patterned second material layer 120 are present. Because the first material layer 110 is chemically different from the patterned second material layer 120, the surface energy of the first material layer 110 may be exclusively lowered even both the first material layer 110 and the patterned second material layer 120 are present. FIG. 4 shows the patterned second material layer 120 is formed on the modified first material layer 110. FIG. 4A shows the top view of FIG. 4. FIG. 4B shows the patterned second material layer 120 is embedded in the modified first material layer 110. FIG. 4C shows the patterned second material layer 120 is recessed in the modified first material layer 110.

Preferably, a hydrophobic material 131 or a super-hydrophobic material 131 is applied to both the first material layer 110 and the patterned second material layer 120, but hydrophobic molecules 132 in the hydrophobic material 131 are selectively introduced to the surface 111 of the first material layer 110 to exclusively lower the surface energy of the first material layer 110. For example, a hydrophobic layer 130 of the hydrophobic material 131 is exclusively attached to the first material layer 110 but substantially not attached to the patterned second material layer 120 when both the first material layer 110 and the patterned second material layer 120 are present.

The hydrophobic layer 130 may include hydrophobic molecules 132 or super-hydrophobic molecules 132 such as silanes or acids with moieties of high affinity to the first material layer 110. The silanes may be linear alkyl silanes, branched alkyl silanes, fluorinated alkyl silanes, chlorinated silanes, or aryl silanes, such as 1H,1H,2H,2H-fluorooctyl-triethoxysilane, 1H,1H,2H,2H-fluorodecyl-triethoxysilane, heptyltrimethoxysilane, and octyltrichlorosilane. The silanes may be chemically attached to the first material layer 110 by hydrolytic deposition or by anhydrous deposition. The acids may be fluorinated acids, perfluorinated acids, chlorinated acids, carboxylic acids, sulfonic acids, perfluorosulfonates, or acid anhydride, such as perfluorooctanoic acid (PFOA), perfluorodecaonic acid (PFDA) or perfluorooctane sulfonate (PFOS). It is suggested to take advantage of different degrees of chemical reactivity of certain potential chemicals to generate a surface with different levels of hydrophobicity (surface energy). FIG. 4 shows a silane is attached to the first material layer 110. FIG. 4B shows a carboxylic acid is attached to the first material layer 110. FIG. 4C shows a sulfonic acid is attached to the first material layer 110.

Because the first material layer 110 is chemically different from the patterned second material layer 120, the first material layer 110 and the patterned second material layer 120 have substantially different chemical reactivity to the hydrophobic molecules. Preferably, the first material layer 110 has better chemical reactivity to the hydrophobic molecules than the patterned second material layer 120 to the hydrophobic molecules. The hydrophobic molecules may react with the first material layer 110 at an elevated temperature or at room temperature. For example, the hydrophobic molecules may react with the first material layer 110 in a temperature range usually not more than 200° C. in a vaporized condition or in a sublimed condition for a period of time, for example from seconds to hours. The first material layer 110 and the patterned second material layer 120 may be metal, nonmetal, metal oxides, nonmetal oxides, inorganic oxides, inorganic compound or alloy, independently and respectively.

If the first material layer 110 has high chemical reactivity to the hydrophobic molecules, the patterned second material layer 120 may have moderate or low chemical reactivity to the hydrophobic molecules. When the first material layer 110 has high or moderate chemical reactivity to the hydrophobic molecules, the patterned second material layer 120 may have low chemical reactivity to the hydrophobic molecules. After the selective surface modification, different levels of hydrophobicity are created on the surfaces of different material layers. Table 1 shows the different chemical reactivity of some example materials to some example hydrophobic molecules.

TABLE 1

| chemical reactivity | | |
|---|---|---|
| high | moderate | low |
| $Al_2O_3$, ITO, SiOx (quartz, silica), silicon | $TiO_2$, $Fe_2O_3$, SnO, $Cr_2O_3$, iron, zinc, copper, steel, nickel | $SiO_2$ (thermally evaporated), $CaCO_3$, $CaSO_4$, graphite |

For example, if the first material layer 110 is one of tin oxide, chromium oxide, titanium oxide, iron oxide, nickel, iron, zinc, steel, copper, thermally evaporated silicon oxide, calcium carbonate, calcium sulfate and graphite, the first material layer may be one of aluminum oxide, ITO, quartz, silica and silicon. Or, when the patterned second material layer is one of thermally evaporated silicon oxide, calcium carbonate, calcium sulfate and graphite, the first material layer may be one of aluminum oxide, ITO, quartz, silica, silicon, tin oxide, chromium oxide, titanium oxide, iron oxide, nickel, iron, zinc, steel and copper.

The selective modification step leads to the change of wettability, i.e. the contact angle, of the surfaces of the material layers. Generally speaking, the higher the contact angle is, the better the selective modification can be, or the better the coverage rate of the hydrophobic molecules on the surfaces of the material layers is. Table 2 shows the change of the water contact angle ($\Delta$WCA) of two example material layers before and after the selective modification with PFDA.

TABLE 2

| | before | | after | | $\Delta$WCA (°) | $\Delta$WCA (°) ($SiO_2$ and $Al_2O_3$ after modification) |
|---|---|---|---|---|---|---|
| WCA (°) | averaged | 3σ* | averaged | 3σ* | | |
| $SiO_2$ | 3.7 | 1.7 | 4.2 | 1.9 | 0.5** | 103.2 |
| $Al_2O_3$ | 4.5 | 2.6 | 107.4 | 3.1 | 102.9 | (107.4-4.2) |

*σ = standard deviation
**substantially unchanged

The $SiO_2$ employed here was made by Himax's thermal evaporator.

Table 3 shows the coverage rate versus the water contact angle (WCA) of chemically modified $Al_2O_3$ with octyltriethoxysilane.

TABLE 3

| coverage % | averaged WCA (°) | 3σ |
|---|---|---|
| 100% | 104.8 | 1.5 |

Figure 11:
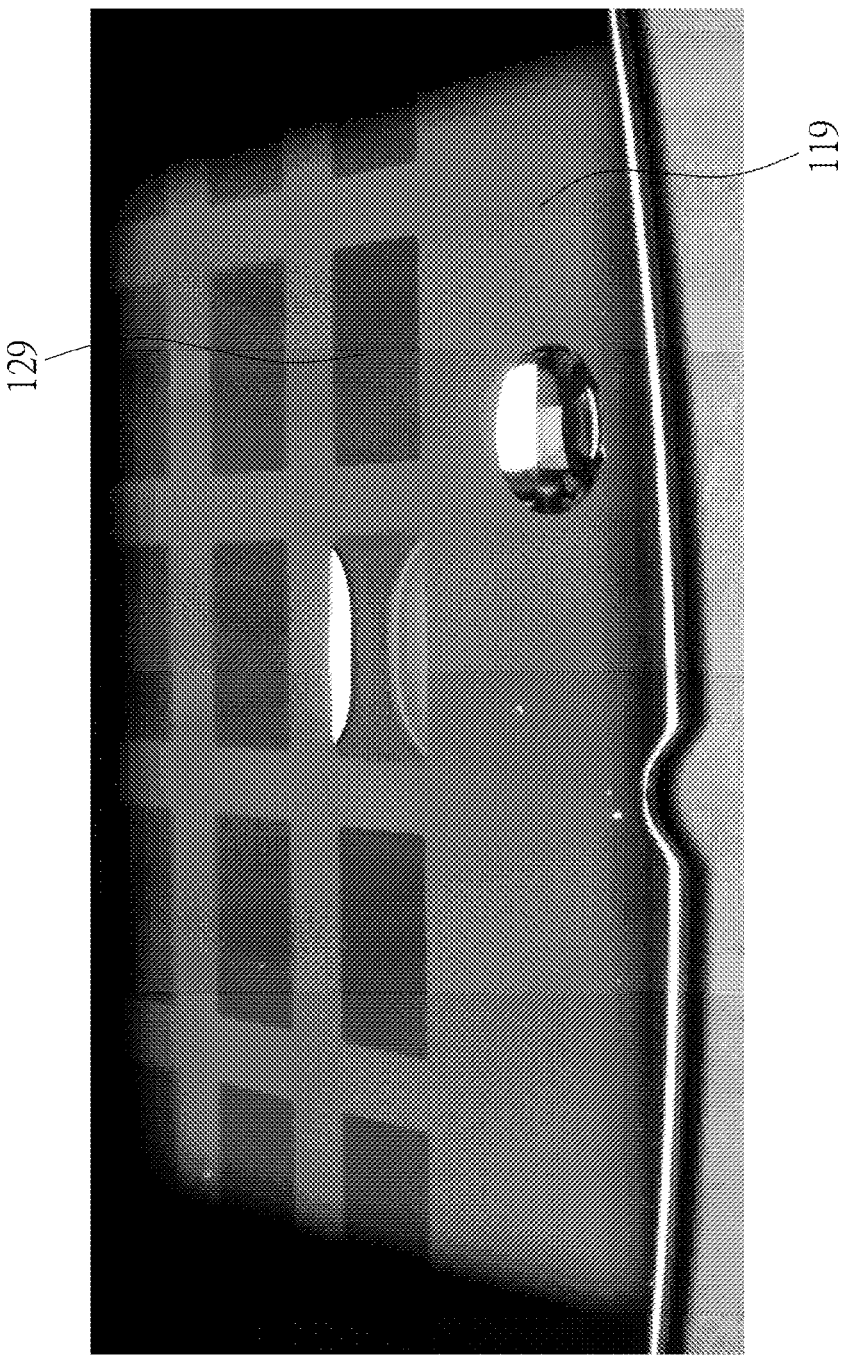
FIG. 11 shows water droplets are on the surfaces of thermally evaporated $SiO_2$ and of $Al_2O_3$ before modification.
Figure 11A:
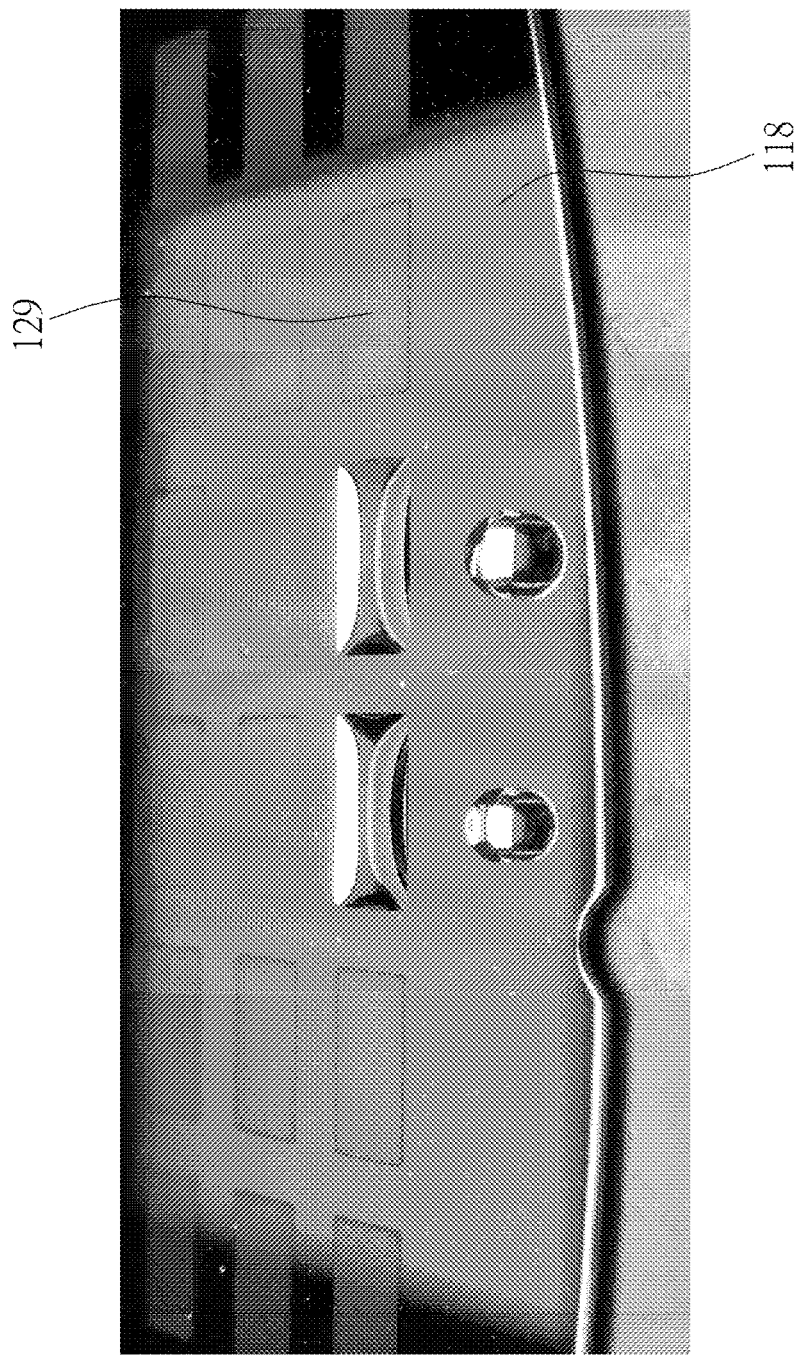
FIG. 11A shows water droplets are distinctive on the surfaces of thermally evaporated $SiO_2$ and of modified $Al_2O_3$ after modification.

It is observed that the hydrophobic molecules may substantially react with aluminum oxide instead of silicon oxide to achieve the desirable selective modification in the method of the present invention. The first material layer 110 has much greater reaction rate in terms of silanes or of acids. By contrast with the first material layer 110, the patterned second material layer 120 has by far slower reaction rate and exhibits a resultant much smaller water contact angle. FIG. 11 shows water droplets are on the surfaces of $SiO_2$ 129 and of $Al_2O_3$ 119 before modification and FIG. 11A shows water droplets are distinctive on the surfaces of $SiO_2$ 129 and of $Al_2O_3$ 118 after modification.

Figure 5:
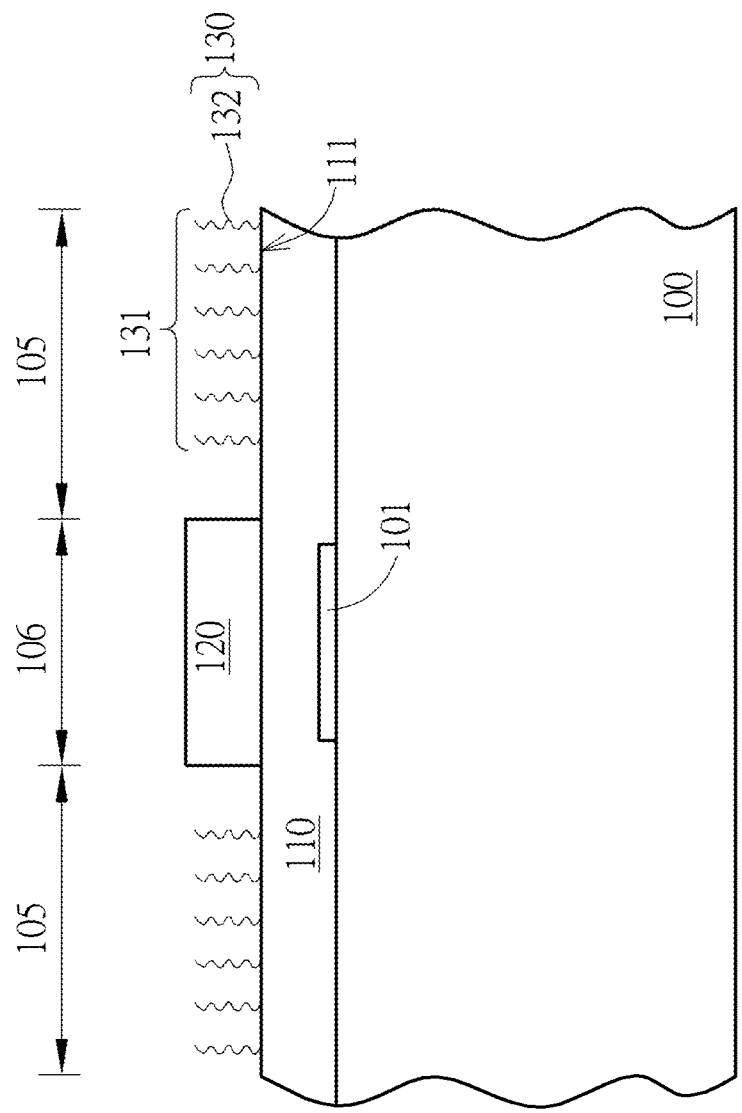

As shown in FIG. 5, after the completion of the selective modification, an examining step is subsequently carried out to exam an electrical property of the embedded element 101. For example, the examining step may be used to measure the driving voltage, to measure the viscosity coefficient of the MEMS (mirror), or to check if any defects exist in the cell. The examining step is well known by persons of ordinary skills in the art so the details are not elaborated here.

Figure 6:
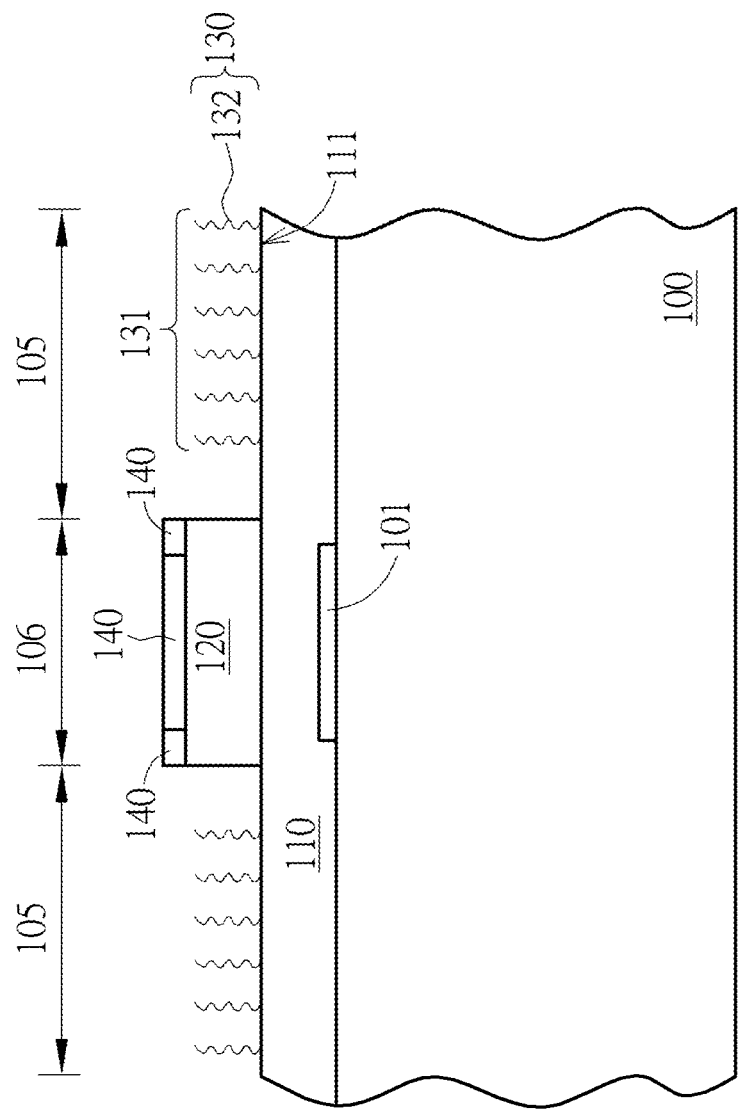
Figure 6A:
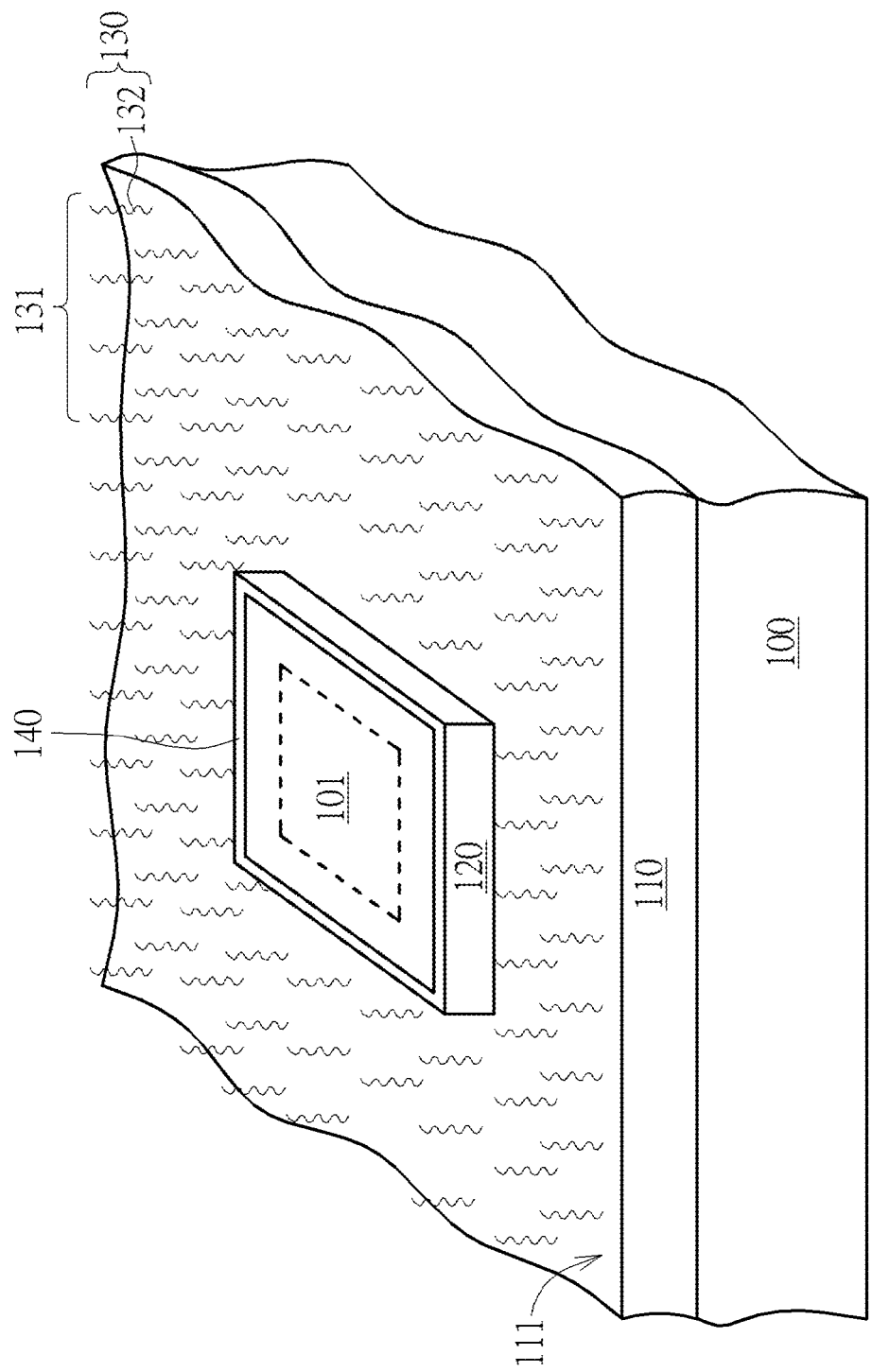
FIG. 6A shows the top view of FIG. 6.
Figure 6B:
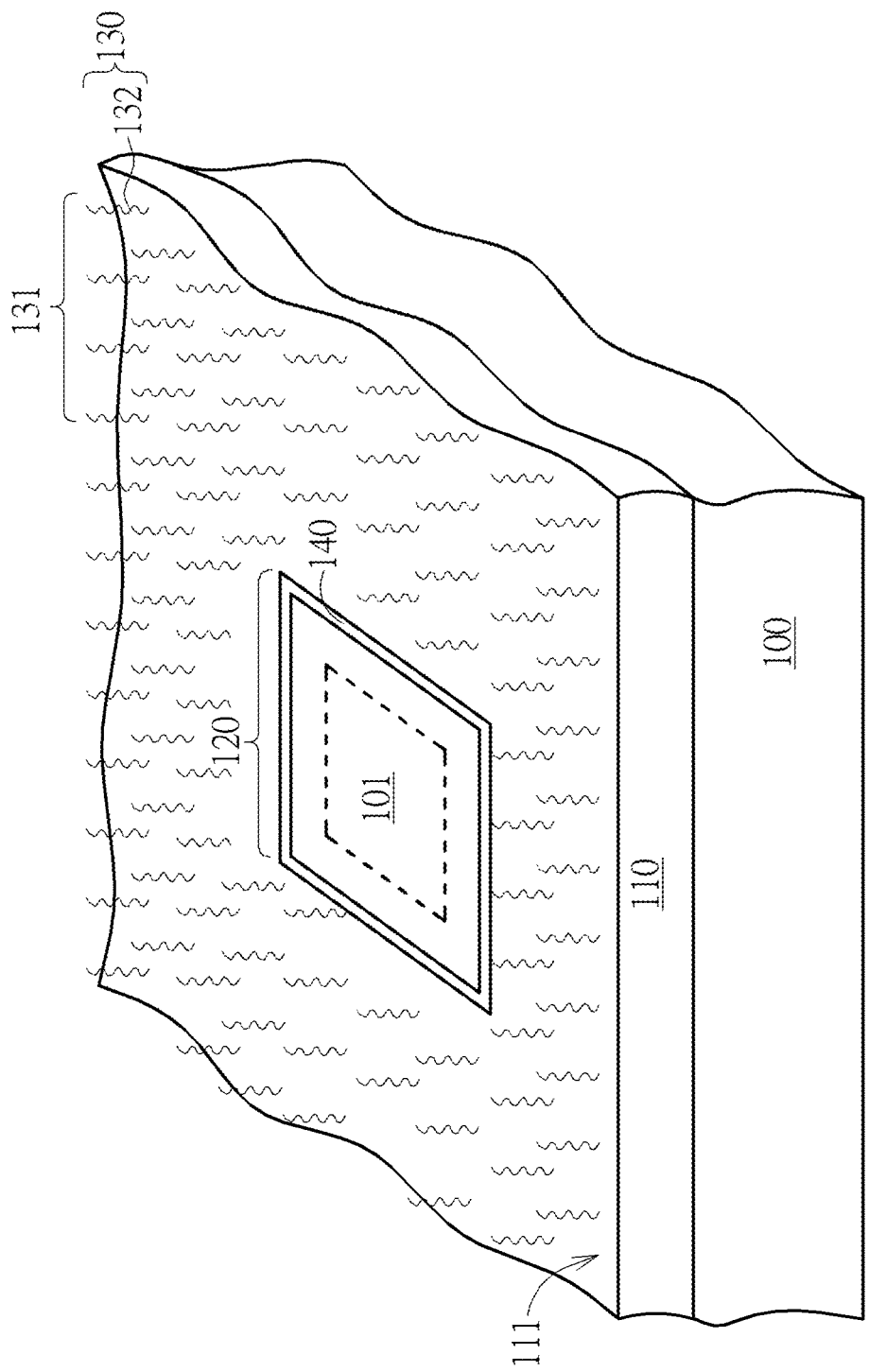
FIG. 6B shows the top view in accordance with FIG. 4B.
Figure 6C:
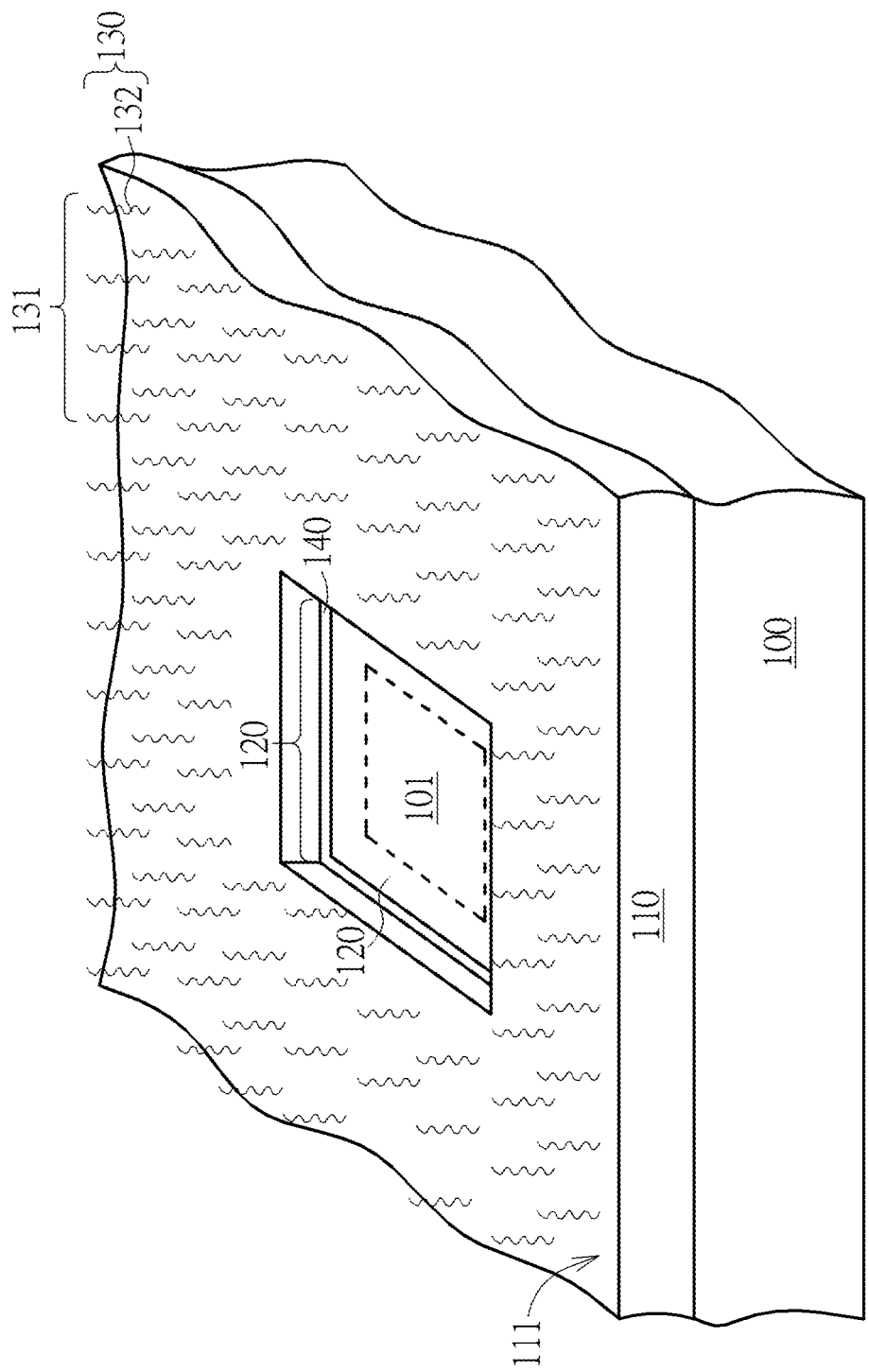
FIG. 6C shows the top view in accordance with FIG. 4C.

Later, as shown in FIG. 6, an adhesive 140 is applied on the substrate 100, for example on the patterned second material layer 120. Preferably, the adhesive 140 is applied along the edges of the patterned second material layer 120 in a form of a close-loop. Due to the much lower surface energy of the first material layer 110, the adhesive 140 is hardly capable of attaching to the surface 111 of the first material layer 110 even the application of the adhesive 140 around the patterned second material layer 120 is slightly less accurate or precise. Accordingly, the adhesive 140 is liable to self-align with the geometric shape of the patterned second material layer 120. The adhesive 140 may be a liquid sealant material, such as an epoxy resin. FIG. 6A shows the perspective view of FIG. 6. FIG. 6B shows the perspective view in accordance with FIG. 4B. FIG. 6C shows the perspective view in accordance with FIG. 4C.

Figure 6D:
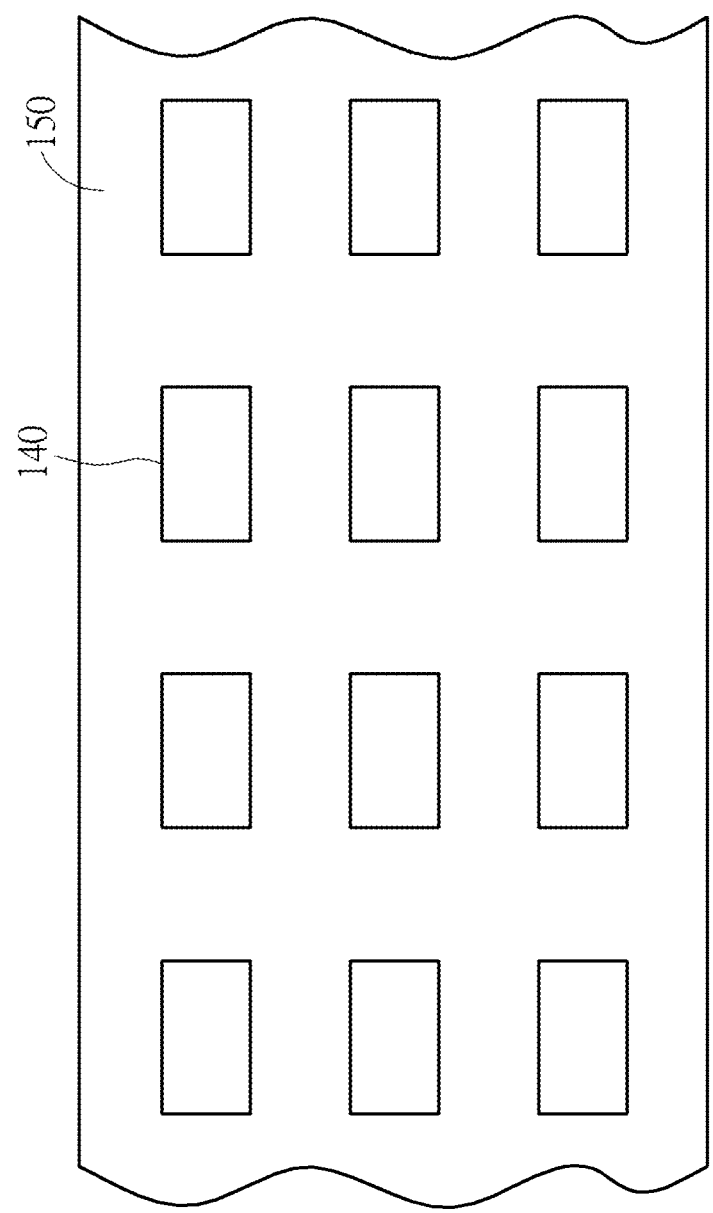
FIG. 6D shows the sealant rectangles arranged in a straight pattern.

Alternatively, as shown in FIG. 6D or in FIG. 6E, the adhesive 140 may be applied on a cover layer 150 instead. The adhesive 140 may be applied on the cover layer 150 to form close-loop sealant in a rectangular shape, preferably in a form of a box. The sealant rectangles 140 may be arranged in particular patterns which correspond to the patterned second material layers 120 on the substrate 100. FIG. 6D shows the sealant rectangles 140 arranged in a straight pattern. FIG. 6E shows the sealant rectangles 140 arranged in an alternate pattern, such as a staggered pattern. The cover layer 150 may be glass.

Figure 7:
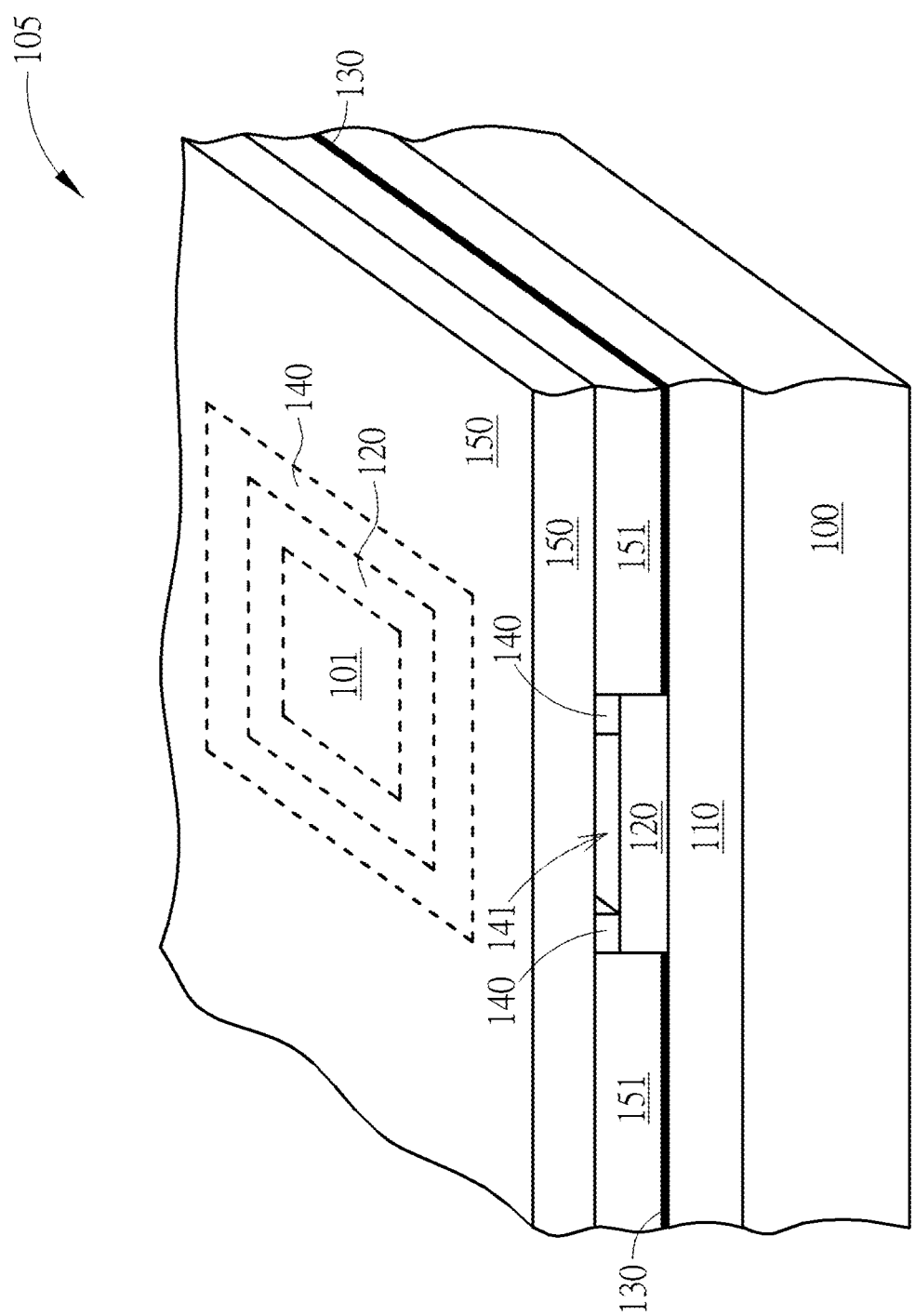

No matter the close-loop sealant 140 is disposed on the substrate 100 or on the cover layer 150, the cover layer 150 is subsequently fixed to the substrate 100 with the help of the close-loop sealant 140 so that the close-loop sealant 140 is sandwiched between the cover layer 150 and the patterned second material layer 120 to obtain an assembly structure 105, as shown in FIG. 7. In other words, the close-loop sealant 140 is attached to both the cover layer 150 and the patterned second material layer 120 with the help of an optional filler 151 to fill the gap between the cover layer 150, the first material layer 110 and the patterned second material layer 120. In particular, the close-loop sealant 140, the cover layer 150 and the patterned second material layer 120 together define an empty sealed space 141. The cover layer 150 may be fixed to the substrate 100 under a pressure around 1 atm or slightly less than 1 atm.

Figure 8:
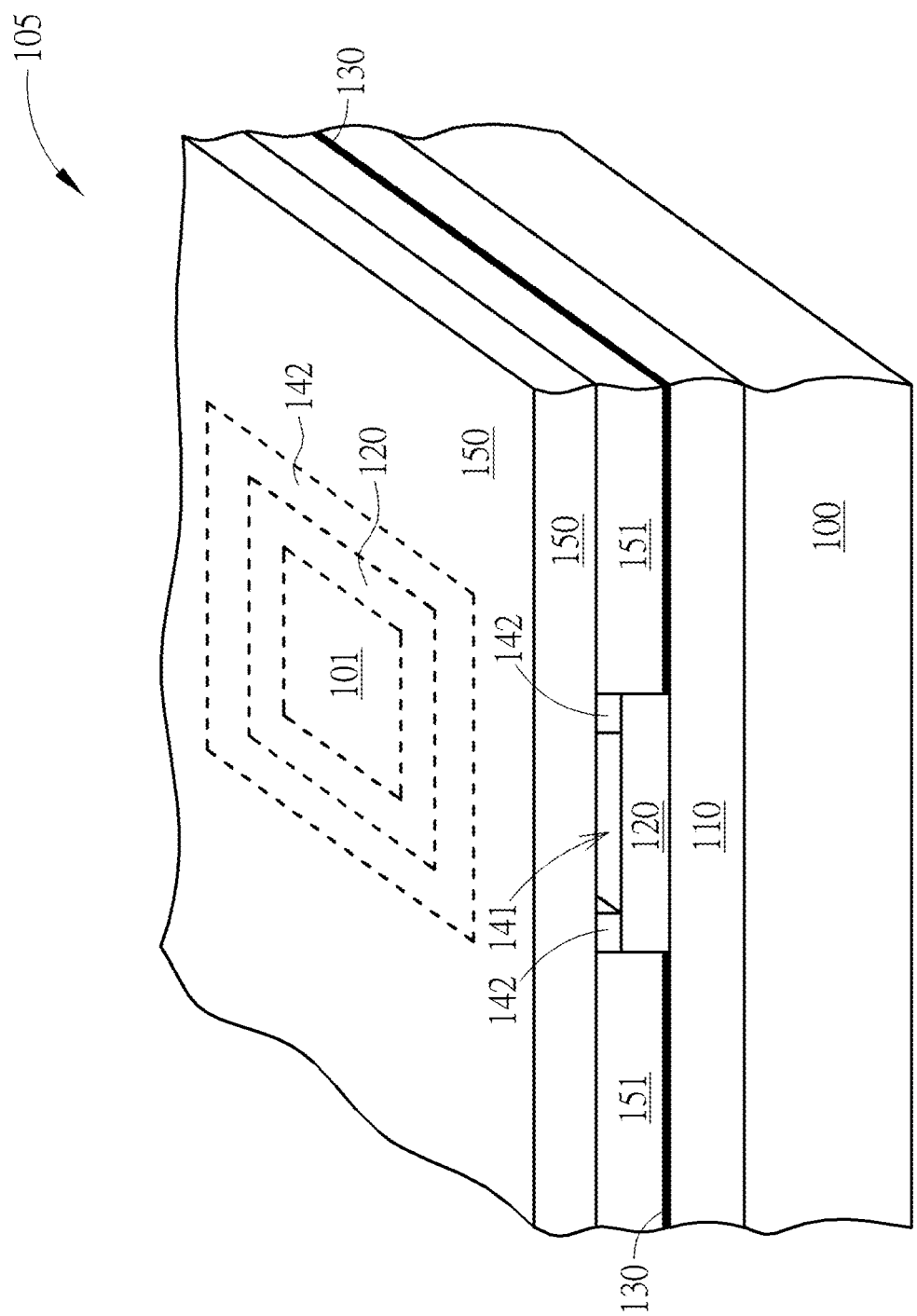

Then, please refer to FIG. 8, the adhesive, i.e. the close-loop sealant 140, is cured to form a solid sealant wall 142 inside the assembly structure 105. The adhesive, i.e. the close-loop sealant 140, may be cured by heat or by light to be in a form of a box. For example, if the adhesive is cured by heat, the adhesive may be subject to an elevated temperature about 130° C. to 160° C. for about 1 hr to about 3 hrs. Alternatively, if the adhesive is cured by light, the adhesive may be subject to UV light of 365 nm at an energy density about 4500~7500 mJ/cm$^2$ for about 1 hr to about 3 hrs. When the adhesive is properly cured to form a close-loop sealant structure 142, i.e. the solid sealant wall 142, a concrete assembly structure 105 is consequently obtained. The close-loop sealant structure 142 is attached to both the cover layer 150 and to the patterned second material layer 120 within the concrete assembly structure 105.

Figure 9:
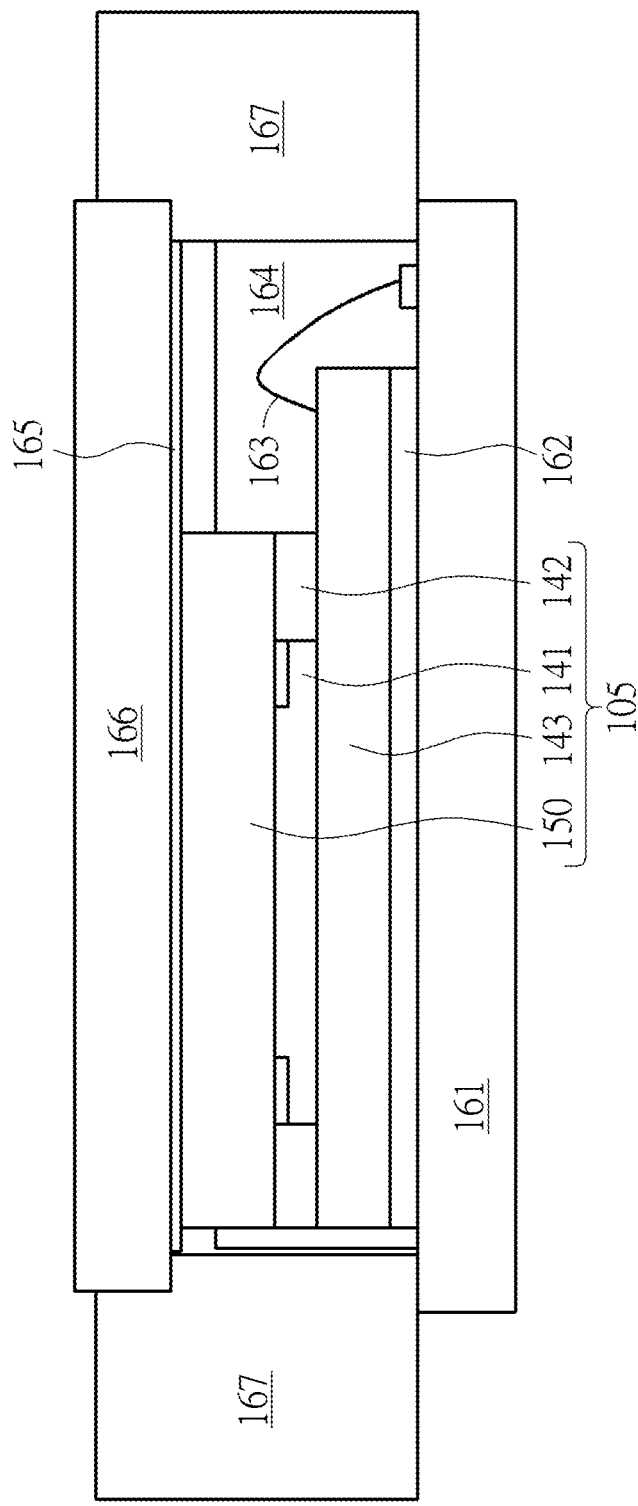
FIG. 9 illustrates a concrete assembly structure further undergoes a packaging step to form an assembly package structure.

Optionally, please refer to FIG. 9, the concrete assembly structure 105 may further undergo a cutting step and a packaging step to form an assembly package structure 106. First, the concrete assembly structure 105 on a wafer is cut off to form multiple MEMS dies. Then, the individual MEMS die 143 underdoes a packaging step to form the assembly package structure 106. The assembly package structure 106 includes the concrete assembly structure 105, a ceramic matrix 161, an adhesive 162, a wire bond 163, an encapsulant 164, a black matrix 165, a top cover 166 and a metal frame 167. The cut concrete assembly structure 105 includes the sealed space 141, the close-loop sealant structure 142, the cut individual MEMS die 143 and the cover layer 150.

The ceramic matrix 161 provides the cut individual MEMS die 143 with the needed circuits (not shown). The ceramic matrix 161 preferably has low thermal resistance. The adhesive 162 is used to firmly fix the cut individual MEMS die 143 onto the ceramic matrix 161. The wire bond 163 is used to electrically connect the circuits on the ceramic matrix 161 and on the cut individual MEMS die 143. The encapsulant 164 is used to seal the wire bond 163. The black matrix 165 may be optionally formed on the top cover 166 or on the cover layer 150. The top cover 166 is used to protect the cut concrete assembly structure 105. The metal frame 167 is used to protect the entire assembly package structure 106.

The packaging step is well known by persons of ordinary skills in the art. For example, the cut individual MEMS die 143 is first firmly fixed onto the ceramic matrix 161 with the help of the adhesive 162. Then, the metal frame 167 and the ceramic matrix 161 are assembled together. Next, the wire bond 163 is formed and followed by the assembly of the top cover 166.

Figure 10:
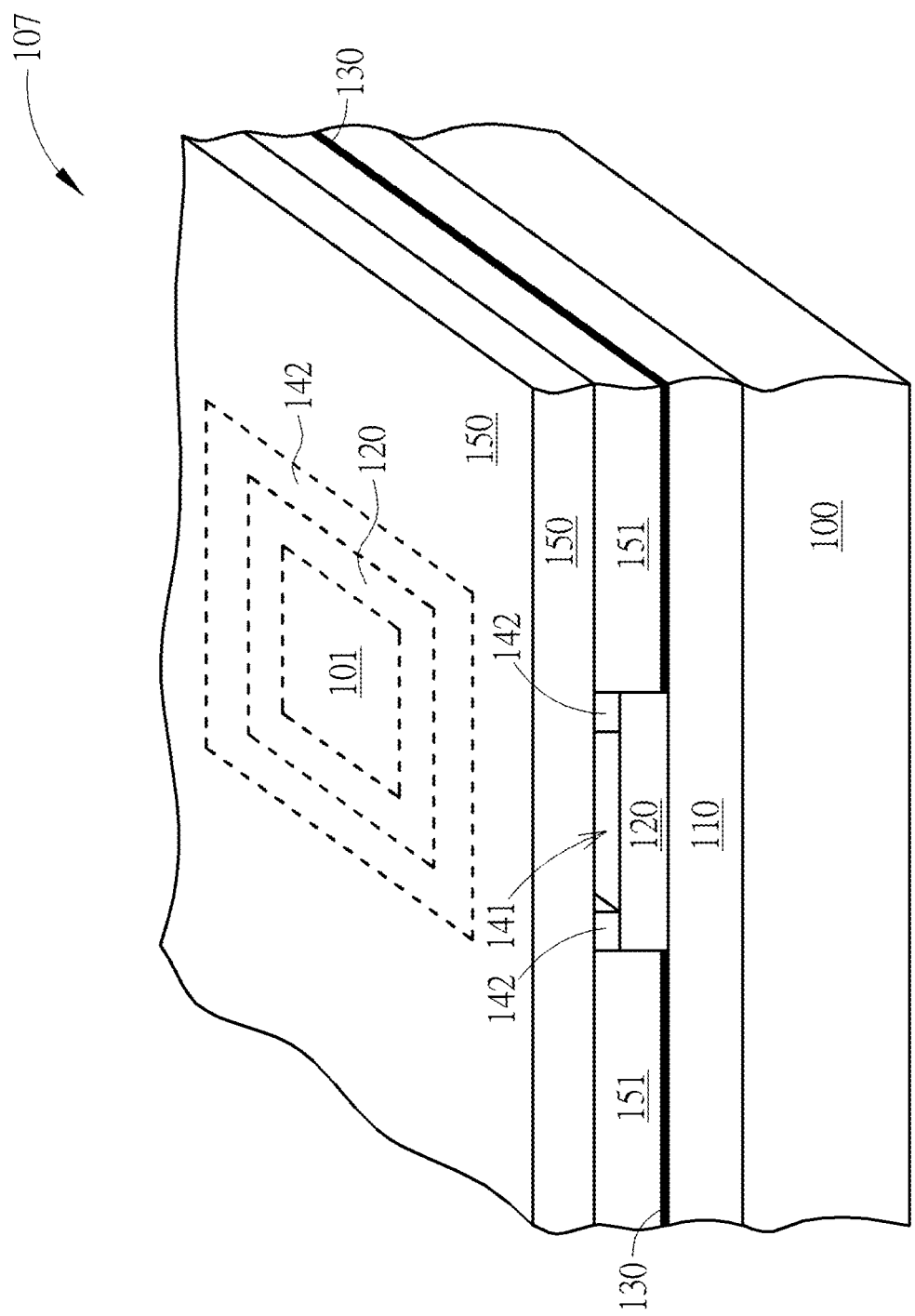
FIG. 10, FIG. 10A or FIG. 10B illustrates an assembly structure of the present invention.
Figure 10A:
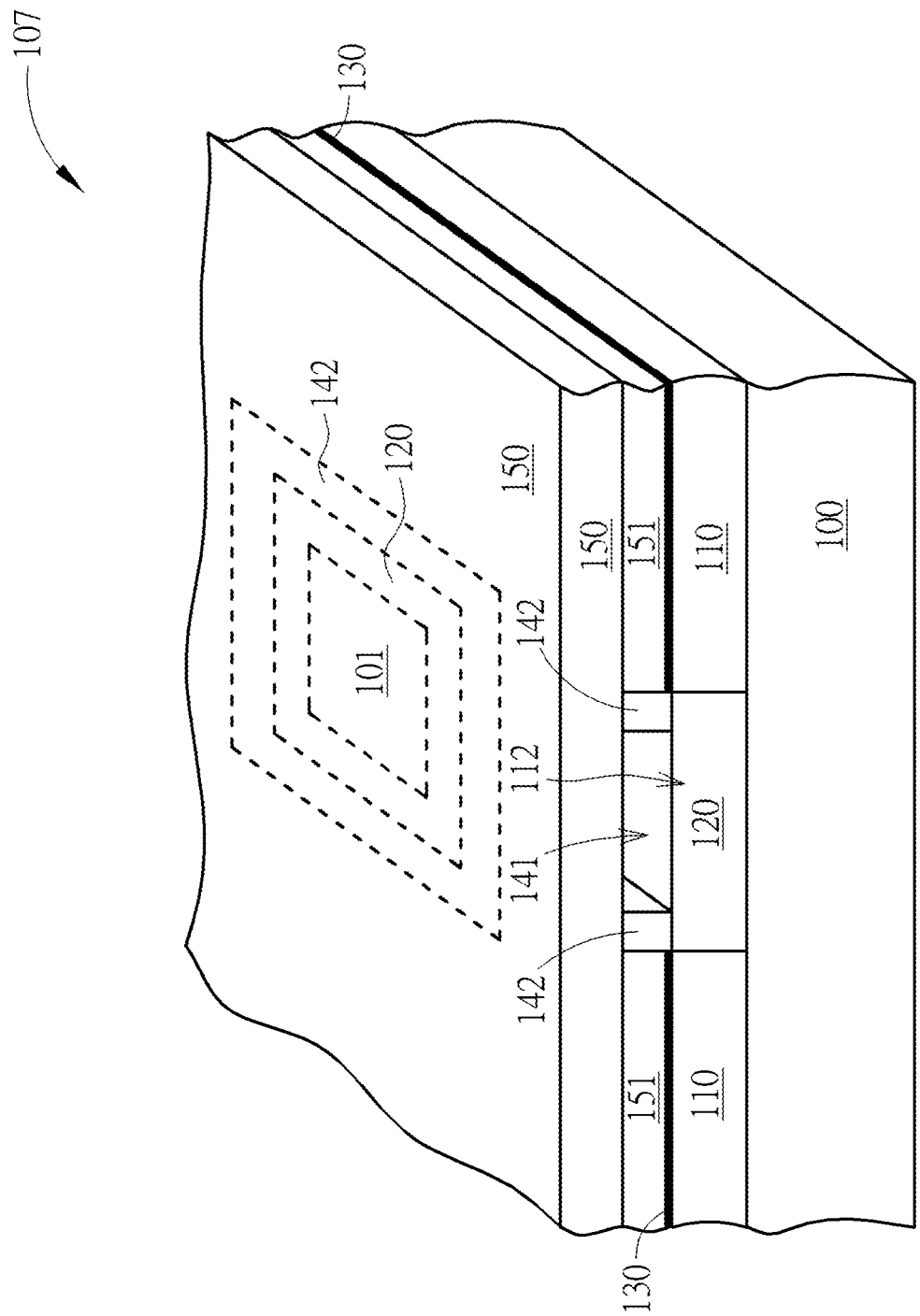
Figure 10B:
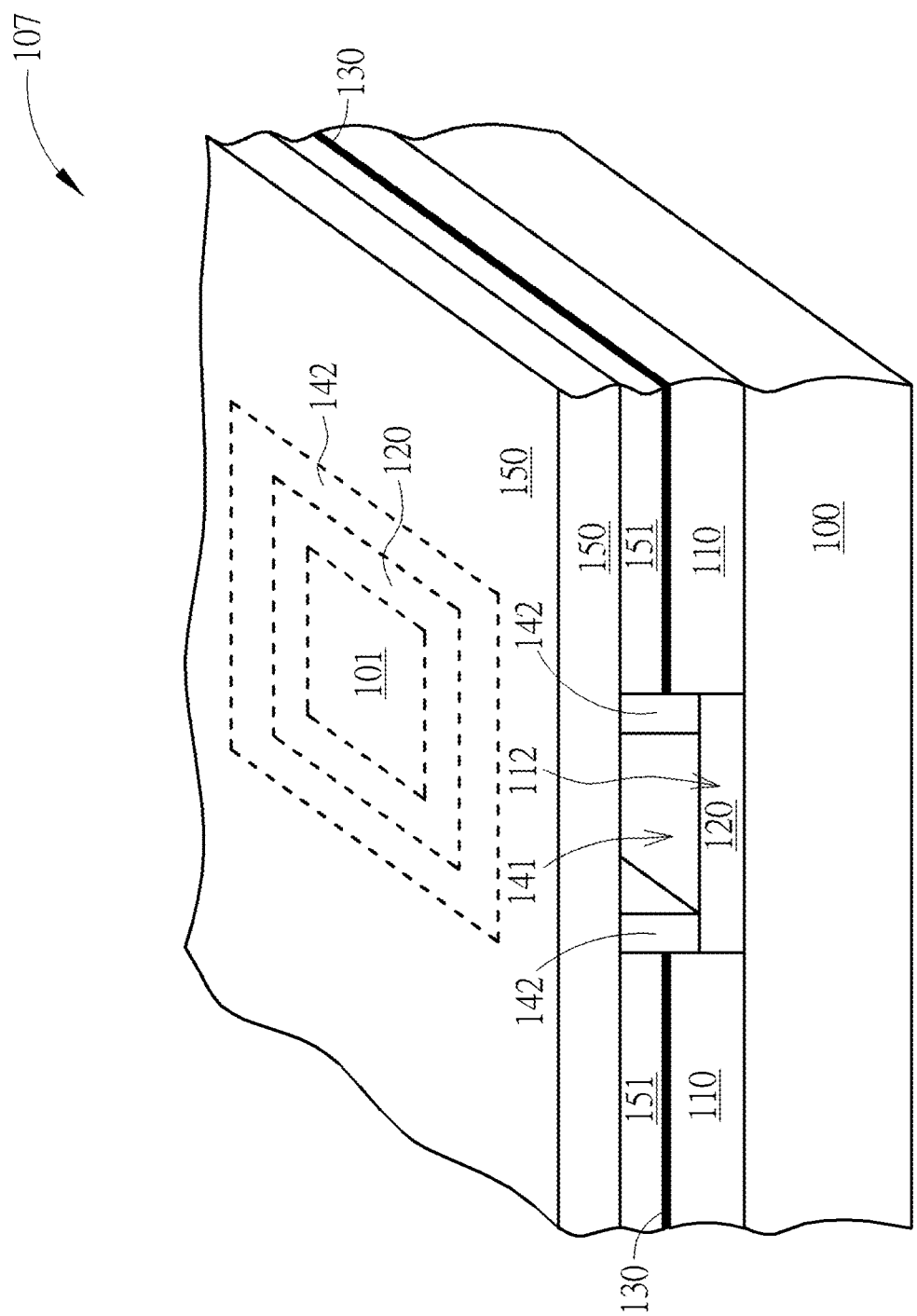

After the above steps, an assembly structure 107 is formed. As illustrated in FIG. 10, FIG. 10A or FIG. 10B, the assembly structure 10 of the present invention includes a substrate 100, a first material layer 110, a patterned second material layer 120, a hydrophobic layer 130, a close-loop sealant wall 142 and a cover layer 150.

The element 101 is disposed on the substrate 100. For example, the embedded element 101 may be an optical element or a MEMS element, such as a micro-mirror, an electrode or a hinge. The substrate 100 may be a silicon wafer.

The first material layer 110 is disposed on the substrate 100. The patterned second material layer 120 is disposed on the substrate 100 and surrounded by the first material layer 110. The first material layer 110 is materially different from the patterned second material layer 120. The thickness of the first material layer 110 or of the patterned second material layer 120 is not critical or limited, so the thickness of the patterned second material layer 120 may be higher, lower, or as thick as the thickness of the first material layer 110.

If the first material layer 110 has high chemical reactivity to the hydrophobic molecules, the patterned second material layer 120 may have moderate or low chemical reactivity to the hydrophobic molecules. When the first material layer 110 has high or moderate chemical reactivity to the hydrophobic molecules, the patterned second material layer 120 may have low chemical reactivity to the hydrophobic molecules. For example, if the first material layer 110 is one of tin oxide, chromium oxide, titanium oxide, iron oxide, nickel, iron, zinc, steel, copper, thermally evaporated silicon oxide, calcium carbonate, calcium sulfate and graphite, the first material layer may be one of aluminum oxide, ITO, quartz, silica and silicon. Or, when the patterned second material layer is one of thermally evaporated silicon oxide, calcium carbonate, calcium sulfate and graphite, the first material layer may be one of aluminum oxide, ITO, quartz, silica, silicon, tin oxide, chromium oxide, titanium oxide, iron oxide, nickel, iron, zinc, steel and copper.

The patterned second material layer 120 may be formed with respect to the first material layer 110 to result in different embodiments. For example in a first embodiment as shown in FIG. 10, the patterned second material layer 120 is directly disposed on the first material layer 110 and not indirect contact with the substrate 100. In a second embodiment as shown in FIG. 10A, the patterned second material layer 120 is embedded in a recess 112 of the first material layer 110 and in direct contact with the substrate 100. As shown in FIG. 10B in a third embodiment, the patterned second material layer 120 is depressed in a recess 112 of the first material layer 110 and in direct contact with the substrate 100. FIG. 10A and FIG. 10B both illustrate the first material layer 110 is recessed to accommodate the patterned second material layer 120 in direct contact with the substrate 100.

The hydrophobic layer 130 is chemically attached to the first material layer 110 to modify the surface energy of the first material layer 110. The hydrophobic layer 130 may include hydrophobic molecules 132 or super-hydrophobic molecules 132 such as silanes or acids with moieties of high affinity to the first material layer 110. The silanes may be linear alkyl silanes, branched alkyl silanes, fluorinated alkyl silanes, chlorinated silanes, or aryl silanes, such as 1H,1H, 2H,2H-fluorooctyl-triethoxysilan, 1H,1H, 2H,2H-fluorodecyl-triethoxysilan, heptyltrimethoxysilane, and octyltrichlorosilane. The acids may be fluorinated acids, perfluorinated acids, chlorinated acids, carboxylic acids, sulfonic acids, perfluorosulfonates, or acid anhydride, such as perfluorooctanoic acid (PFOA), perfluorodecaonic acid (PFDA) or perfluorooctane sulfonate (PFOS).

The close-loop sealant wall 142 is directly disposed on the patterned second material layer 120 to have a rectangular rim, for example in a form of a box. The close-loop sealant wall 142 may be a cured adhesive, such as a cured epoxy resin. Preferably, the close-loop sealant wall 142 is disposed along the sides of the patterned second material layer 120 in a form of a rectangle, such as a box and not disposed on the first material layer 110. Further, the close-loop sealant wall 142 is preferably not in direct contact with the hydrophobic layer 130. The close-loop sealant wall 142 may be arranged in particular patterns which correspond to the patterned second material layer 120 on the substrate 100 so the close-loop sealant wall 142 is liable to self-align with the geometric shape of the patterned second material layer 120.

The cover layer 150 is in direct contact with the close-loop sealant wall 142 to entirely cover the close-loop sealant wall 142. There may be an optional filler 151 to fill the gap between the cover layer 150, the first material layer 110 and the patterned second material layer 120.

The present invention provides a novel method to form an assembly structure or to form a close-loop sealant structure. The novel method eliminates two steps: 1) deterioration of the first surface modification and 2) second surface modification, to demonstrate a simpler process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An assembly structure, comprising: an element disposed on and in direct contact with a substrate; a first material layer disposed on said substrate and in direct contact with said element; a hydrophobic layer chemically attached to said first material layer to modify the surface energy of said first material layer; a patterned second material layer disposed on said substrate and surrounded by said first material layer, wherein said first material layer is different from said patterned second material layer; a close-loop sealant wall directly disposed on and self-align with said patterned second material layer and a bottom of said close-loop sealant wall directly and partially covering a top surface of said patterned second material layer; said close-loop sealant, said cover layer and said patterned second material layer together to define an empty sealed space; and a cover layer in direct contact with a top surface of said close-loop sealant wall to entirely cover said close-loop sealant wall, wherein said close-loop sealant wall is in a form of a box.

2. The assembly structure of claim 1, wherein said element comprises at least one of an optical element and a MEMS element.

3. The assembly structure of claim 1, wherein said patterned second material layer has a rectangular rim.

4. The assembly structure of claim 1, wherein said patterned second material layer is selected from a group consisting of tin oxide, chromium oxide, titanium oxide, iron oxide, nickel, iron, zinc, steel, copper, thermally evaporated silicon oxide, calcium carbonate, calcium sulfate and graphite when said first material layer is selected from a group consisting of aluminum oxide, ITO, quartz, silica and silicon, and said patterned second material layer is selected from a group consisting of thermally evaporated silicon oxide, calcium carbonate, calcium sulfate and graphite when said first material layer is selected from a group consisting of aluminum oxide, ITO, quartz, silica, silicon, tin oxide, chromium oxide, titanium oxide, iron oxide, nickel, iron, zinc, steel and copper.

5. The assembly structure of claim 1, wherein said first material layer is recessed to accommodate said patterned second material layer in direct contact with said substrate.

6. The assembly structure of claim 1, wherein said patterned second material layer is disposed on said first material layer and not in direct contact with said substrate.

7. The assembly structure of claim 1, wherein said hydrophobic layer is not in direct contact with said close-loop sealant wall.

* * * * *